United States Patent
Papandreou et al.

(10) Patent No.: US 11,302,403 B2
(45) Date of Patent: *Apr. 12, 2022

(54) CALCULATING CORRECTIVE READ VOLTAGE OFFSETS IN NON-VOLATILE RANDOM ACCESS MEMORY

(71) Applicant: International Business Machines Corporation, Armonk, NY (US)

(72) Inventors: Nikolaos Papandreou, Thalwil (CH); Charalampos Pozidis, Thalwil (CH); Nikolas Ioannou, Zurich (CH); Roman Alexander Pletka, Uster (CH); Radu Ioan Stoica, Zurich (CH); Sasa Tomic, Kilchberg (CH); Timothy Fisher, Cypress, TX (US); Aaron Daniel Fry, Richmond, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/149,592

(22) Filed: Jan. 14, 2021

(65) Prior Publication Data

US 2021/0134378 A1    May 6, 2021

Related U.S. Application Data

(63) Continuation of application No. 16/669,241, filed on Oct. 30, 2019, now Pat. No. 10,957,407.

(51) Int. Cl.
*G11C 16/06* (2006.01)
*G11C 16/34* (2006.01)
(Continued)

(52) U.S. Cl.
CPC ........ *G11C 16/3422* (2013.01); *G06F 11/076* (2013.01); *G11C 16/08* (2013.01);
(Continued)

(58) Field of Classification Search
CPC ...... G11C 16/3422; G11C 16/08; G11C 16/26
(Continued)

(56) References Cited

U.S. PATENT DOCUMENTS

| 8,111,549 B2 | 2/2012 | Yip |
| 9,715,341 B2 | 7/2017 | Kim et al. |

(Continued)

FOREIGN PATENT DOCUMENTS

| CN | 105205008 A | 12/2015 |
| CN | 106528323 A | 3/2017 |

OTHER PUBLICATIONS

Corrected Notice of Allowance from U.S. Appl. No. 16/669,241, dated Feb. 18, 2021.
(Continued)

*Primary Examiner* — Vu A Le
(74) *Attorney, Agent, or Firm* — Zilka-Kotab, P.C.

(57) ABSTRACT

A computer-implemented method, according to one approach, is for calibrating read voltages associated with a block of memory having more than one word-line therein. The computer-implemented method includes: for each of the word-lines in the block: calculating an absolute shift value for a reference read voltage associated with the given word-line. A relative shift value is also determined for each of the remaining read voltages associated with the given word-line, and the relative shift values are determined with respect to the reference read voltage. Moreover, each of the read voltages associated with the given word-line are adjusted using the absolute shift value and each of the respective relative shift values.

20 Claims, 14 Drawing Sheets

(51) Int. Cl.
*G06F 11/07* (2006.01)
*G11C 16/08* (2006.01)
*G11C 16/26* (2006.01)

(52) U.S. Cl.
CPC ...... *G11C 16/26* (2013.01); *G11C 2211/5634* (2013.01); *G11C 2211/5648* (2013.01)

(58) Field of Classification Search
USPC .................................................... 365/185.09
See application file for complete search history.

(56) References Cited

U.S. PATENT DOCUMENTS

| | | | |
|---|---|---|---|
| 9,720,754 | B2 | 8/2017 | Karakulak et al. |
| 10,276,233 | B1 | 4/2019 | Danjean et al. |
| 10,957,407 | B1 | 3/2021 | Papandreou et al. |
| 2009/0003058 | A1 | 1/2009 | Kang |
| 2013/0159798 | A1 | 6/2013 | Yang |
| 2014/0043903 | A1* | 2/2014 | Ok .................... G11C 29/028 365/185.03 |
| 2014/0229131 | A1* | 8/2014 | Cohen ................ G11C 16/3427 702/64 |
| 2017/0076790 | A1 | 3/2017 | Sasaki et al. |
| 2017/0229186 | A1 | 8/2017 | Karakulak et al. |
| 2018/0203796 | A1 | 7/2018 | Park et al. |
| 2019/0043588 | A1 | 2/2019 | Fisher et al. |
| 2019/0043591 | A1 | 2/2019 | Fastow et al. |
| 2019/0107961 | A1 | 4/2019 | Lee |
| 2019/0146671 | A1 | 5/2019 | Camp et al. |

OTHER PUBLICATIONS

Papandreou et al., U.S. Appl. No. 16/554,371, filed Aug. 28, 2019.
Papandreou et al., U.S. Appl. No. 16/669,241, filed Oct. 30, 2019.
Notice of Allowance from U.S. Appl. No. 16/669,241, dated Nov. 13, 2020.
International Search Report and Written Opinion from PCT Application No. PCT/EP2020/079198, dated Jan. 13, 2021.
Corrected Notice of Allowance from U.S. Appl. No. 16/669,241, dated Jan. 21, 2021.
List of IBM Patents or Patent Applications Treated as Related, Feb. 3, 2021, 2 pages.

* cited by examiner

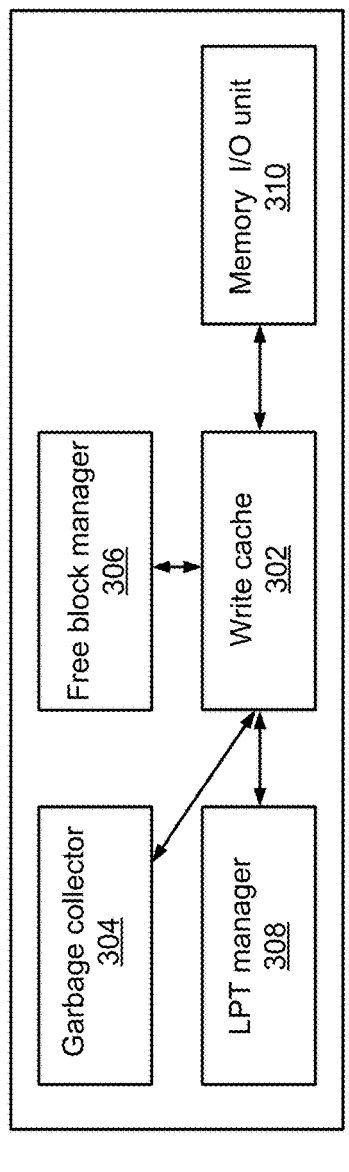
FIG. 3
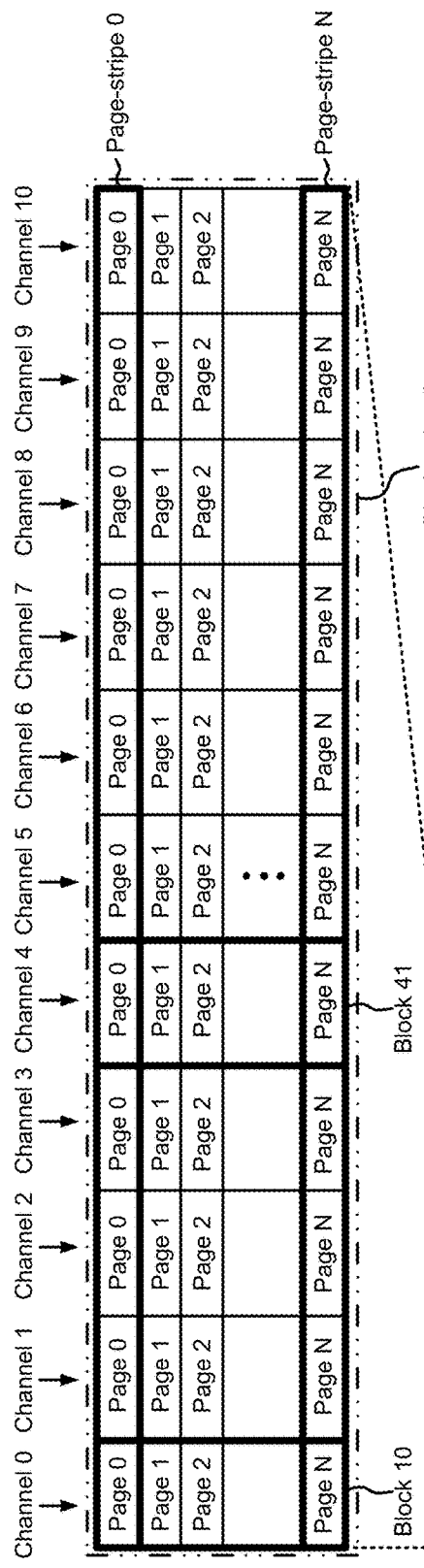
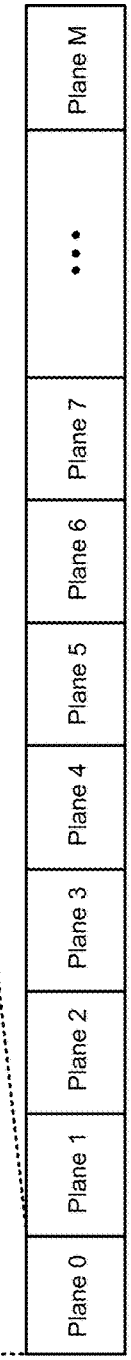
FIG. 4A

| States | Program/Erase Cycles | Retention Time | Read-disturb Cycles | Temperature |
|---|---|---|---|---|
| $s_1$ | 0 - 1000 cycles | 0 hrs | 0 cycles | 40C |
| $s_2$ | 1000 - 2000 cycles | 0 hrs | 0 cycles | 40C |
| ... | ... | ... | ... | ... |
| $s_{k+1}$ | 0 - 1000 cycles | 0 - 24 hrs | 0 cycles | 40C |
| $s_{k+2}$ | 1000 - 2000 cycles | 0 - 24 hrs | 0 cycles | 40C |
| ... | ... | ... | ... | ... |
| $s_{m+1}$ | 0 - 1000 cycles | 1*24 — 7*24 hrs | 0 cycles | 40C |
| $s_{m+2}$ | 1000 - 2000 cycles | 1*24 — 7*24 hrs | 0 cycles | 40C |
| ... | ... | ... | ... | ... |
| $s_{i+1}$ | 0 - 1000 cycles | 1*7*24 — 4*7*24 hrs | 0 cycles | 40C |
| $s_{i+2}$ | 1000 - 2000 cycles | 1*7*24 — 4*7*24 hrs | 0 cycles | 40C |
| ... | ... | ... | ... | ... |
| $s_{j+1}$ | 0 - 1000 cycles | 0 hrs | 0 - 1000 cycles | 40C |
| $s_{j+2}$ | 1000 - 2000 cycles | 0 hrs | 0 - 1000 cycles | 40C |
| ... | ... | ... | ... | ... |
| $s_{t+1}$ | 0 - 1000 cycles | 0 - 24 hrs | 0 - 1000 cycles | 40C |
| $s_{t+2}$ | 1000 - 2000 cycles | 0 - 24 hrs | 0 - 1000 cycles | 40C |
| ... | ... | ... | ... | ... |

| ALL | V1 | V2 | V3 | V4 | V5 | V6 | V7 | V8 | V9 | V10 | V11 | V12 | V13 | V14 | V15 reference |
|---|---|---|---|---|---|---|---|---|---|---|---|---|---|---|---|
| s1 | a(1,1) | a(1,2) | a(1,3) | a(1,4) | a(1,5) | a(1,6) | a(1,7) | a(1,8) | a(1,9) | a(1,10) | a(1,11) | a(1,12) | a(1,13) | a(1,14) | a(1,15) |
| s2 | a(2,1) | a(2,2) | a(2,3) | a(2,4) | a(2,5) | a(2,6) | a(2,7) | a(2,8) | a(2,9) | a(2,10) | a(2,11) | a(2,12) | a(2,13) | a(2,14) | a(2,15) |
| ... | | | | | | | | | | | | | | | |
| sN | a(N,1) | a(N,2) | a(N,3) | a(N,4) | a(N,5) | a(N,6) | a(N,7) | a(N,8) | a(N,9) | a(N,10) | a(N,11) | a(N,12) | a(N,13) | a(N,14) | a(N,15) |

830 →

| LP | V8 reference |
|---|---|
| s1 | a(1,8) |
| s2 | a(2,8) |
| ... | |
| sN | a(N,8) |

840 →

| UP | V4 | V12 reference |
|---|---|---|
| s1 | a(1,4) | a(1,12) |
| s2 | a(2,4) | a(2,12) |
| ... | | |
| sN | a(N,4) | a(N,12) |

850 →

| XP | V2 | V6 | V10 | V14 reference |
|---|---|---|---|---|
| s1 | a(1,2) | a(1,6) | a(1,10) | a(1,14) |
| s2 | a(2,2) | a(2,6) | a(2,10) | a(2,14) |
| ... | | | | |
| sN | a(N,2) | a(N,6) | a(N,10) | a(N,14) |

| TP | V1 | V3 | V5 | V7 | V9 | V11 | V13 | V15 reference |
|---|---|---|---|---|---|---|---|---|
| s1 | a(1,1) | a(1,3) | a(1,5) | a(1,7) | a(1,9) | a(1,11) | a(1,13) | a(1,15) |
| s2 | a(2,1) | a(2,3) | a(2,5) | a(2,7) | a(2,9) | a(2,11) | a(2,13) | a(2,15) |
| ... | | | | | | | | |
| sN | a(N,1) | a(N,3) | a(N,5) | a(N,7) | a(N,9) | a(N,11) | a(N,13) | a(N,15) |

CALCULATING CORRECTIVE READ VOLTAGE OFFSETS IN NON-VOLATILE RANDOM ACCESS MEMORY

BACKGROUND

The present invention relates to data storage systems, and more particularly, this invention relates to calibrating read voltages for blocks of memory configured in multi-bit-per-cell mode in non-volatile random access memory (NVRAM).

NVRAM is a type of random-access memory which retains information stored thereon even after the power supply is turned off, and includes a number of different forms. Using Flash memory as an example, the performance characteristics of conventional NAND Flash-based solid state drives (SSDs) are fundamentally different from those of traditional hard disk drives (HDDs). Data in conventional SSDs is typically organized in pages of 4, 8, or 16 KB sizes. Moreover, page read operations in SSDs are typically one order of magnitude faster than write operations and latency neither depends on the current nor the previous location of operations.

The raw bit error rate (RBER) of a Flash memory block will typically increase over time due to additional program/erase (P/E) cycling, charge leakage over time (i.e., data retention), and additional charge placed in the cells by read or program operations (i.e., read or program disturb errors, respectively). Typically, a Flash memory block is retired when any page in the block exhibits a code word that reaches a page retirement error count limit. This limit is typically set to be achieved in conjunction with an appropriate error correction code (ECC), resulting in the Uncorrectable Bit Error Rate (UBER) after applying the ECC for a Flash memory block being set to be similar to the UBER in traditional hard disk drives, e.g., at around $10^{-15}$, but may be more or less.

Block calibration, which refers to algorithms that adjust the read voltages, has been shown to significantly improve the RBER and therefore enhance endurance and retention, particularly for enterprise-level Flash memory systems using modern three-dimensional (3-D) triple-level-cell (TLC) or quad-level-cell (QLC) NAND Flash memory. Previous attempts to maintain efficient memory performance typically included inspecting the read voltages for each block of memory in a sweeping fashion or by a read voltage shifting algorithm that tracks and corrects the read voltages depending on how the threshold voltage distributions have changed as a result of cycling or retention or other disturbing effects.

Ideally, the read voltages for each page in a block of memory are updated individually. However, as the storage capacity of memory increases, the amount of storage consumed by maintaining a read voltage offset value for each page in each block of memory increases as well. For instance, advancing from 3 bits per cell in TLC NAND Flash memory to 4 bits per cell in QLC NAND Flash memory, each block implements 16 threshold voltage levels (instead of 8 in TLC), and 15 different read voltages (instead of 7 in TLC) to read any of the pages included therein. Moreover, with the improvements in vertical stacking and process technology, the number of layers in every new generation of 3-D NAND Flash increases as well. Subsequently, the number of pages in each block also increases. For example, current 3-D QLC NAND Flash memory may have more than 90 layers and each block may have more than 4000 pages. Thus, if all of these 15 different read voltages in 3-D QLC NAND are calibrated independently (or individually), the amount of metadata involved with storing an individual set of read offset values for each page, or group of pages, in a block and the number of calibration reads per page increases significantly.

As the storage capacity of memory continue to increase, reliability issues associated with the memory increase as well. As a result, conventional calibration engines have experienced an increasing amount of processing overhead caused by the declining reliability of the memory in addition to the increasing number of read voltage offset values that are associated with each page in each block of memory.

SUMMARY

A computer-implemented method, according to one approach, is for calibrating read voltages associated with a block of memory having more than one word-line therein. The computer-implemented method includes: for each of the word-lines in the block: calculating an absolute shift value for a reference read voltage associated with the given word-line. A relative shift value is also determined for each of the remaining read voltages associated with the given word-line, and the relative shift values are determined with respect to the reference read voltage. Moreover, each of the read voltages associated with the given word-line are adjusted using the absolute shift value and each of the respective relative shift values.

A computer program product, according to another approach, is for calibrating read voltages associated with a block of memory having more than one word-line therein. The computer program product includes a computer readable storage medium having program instructions embodied therewith. Moreover, the program instructions are readable and/or executable by a processor to cause the processor to: for each of the word-lines in the block: perform the foregoing method.

A system, according to yet another approach, includes: a plurality of NVRAM blocks configured to store data, and each of the blocks include more than one word-line therein. The system also includes a processor, and logic that is integrated with and/or executable by the processor. The logic is configured to: for each of the word-lines in a given block: perform the foregoing method.

Other aspects and embodiments of the present invention will become apparent from the following detailed description, which, when taken in conjunction with the drawings, illustrate by way of example the principles of the invention.

BRIEF DESCRIPTION OF THE DRAWINGS

FIG. 3 is a system diagram, in accordance with one approach.

FIG. 4A is a conceptual diagram which includes a block-stripe and page-stripe, in accordance with one approach.

FIG. 7 is a table which presents a number of operating states, in accordance with one approach.

FIG. 8A is a table which presents a voltage mapping, in accordance with one approach.

FIG. 8B is a series of tables which present a page type-based voltage mapping, in accordance with one approach.

DETAILED DESCRIPTION

Figure 1:
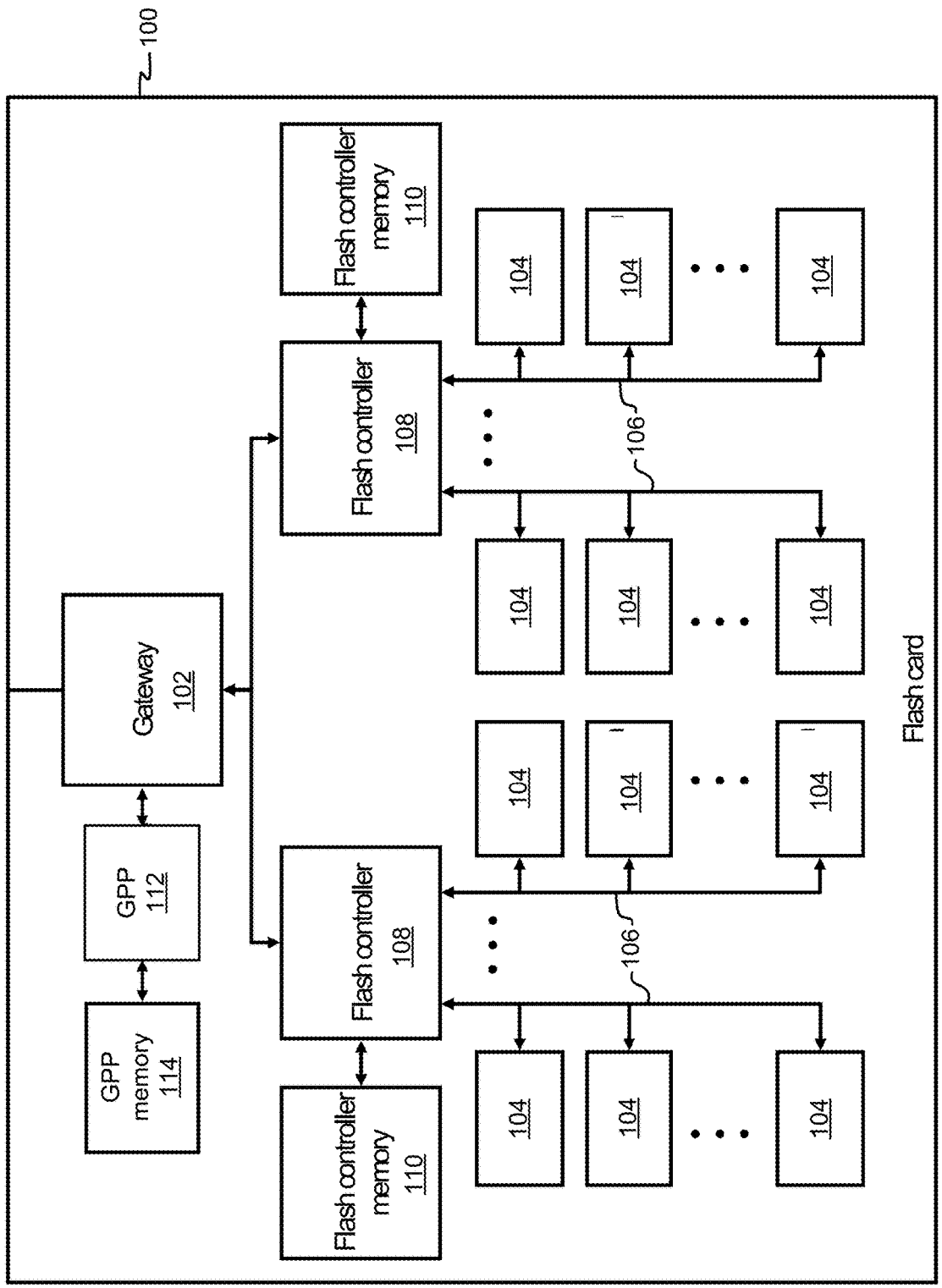
FIG. 1 is a diagram of a non-volatile memory card, in accordance with one approach.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several approaches of data storage systems, as well as operation and/or component parts thereof. It should be appreciated that various approaches herein can be implemented with a wide range of memory mediums, including for example NVRAM technologies such as NAND Flash memory, NOR Flash memory, phase-change memory (PCM), magnetoresistive RAM (MRAM) and resistive RAM (RRAM). To provide a context, and solely to assist the reader, various approaches may be described with reference to a type of non-volatile memory. This has been done by way of example only, and should not be deemed limiting on the invention defined in the claims.

In one general approach, a computer-implemented method is for calibrating read voltages for a block of memory. The computer-implemented method includes: determining a current operating state of a block which includes more than one word-line therein, and where more than one read voltage is associated with each of the word-lines. Moreover, for each of the word-lines in the block: one of the read voltages associated with the given word-line is selected as a reference read voltage, and an absolute shift value is calculated for the reference read voltage. A relative shift value is determined for each of the remaining read voltages associated with the given word-line, where the relative shift values are determined with respect to the reference read voltage. Furthermore, each of the read voltages associated with the given word-line are adjusted using the absolute shift value and each of the respective relative shift values.

In another general approach, a computer program product is for calibrating read voltages for a block of memory. The computer program product includes a computer readable storage medium having program instructions embodied therewith. Moreover, the program instructions readable and/or executable by a processor to cause the processor to: perform the foregoing method.

In yet another general approach, a system includes: a plurality of NVRAM blocks configured to store data, a processor, and logic integrated with and/or executable by the processor. The logic is configured to, for each of the blocks: perform the foregoing method.

In another general approach, a computer-implemented method is for calibrating read voltages for a block of memory. The computer-implemented method includes: determining a current operating state of a block which includes more than one type of page therein, and where at least one read voltage is associated with each of the page types. Moreover, for each word-line in the block: the read voltages are divided into groups based on the respective page types. Furthermore, for each group of read voltages in the given word-line: one of the read voltages in the given group is selected as a reference read voltage. An absolute shift value is also calculated for the reference read voltage. A relative shift value is determined for each of the remaining read voltages in the given group, where the relative shift values are determined with respect to the reference read voltage. Moreover, each of the read voltages in the given group is adjusted using the absolute shift value and each of the respective relative shift values.

FIG. 1 illustrates a memory card 100, in accordance with one approach. It should be noted that although memory card 100 is depicted as an exemplary non-volatile data storage card in the present approach, various other types of non-volatile data storage cards may be used in a data storage system according to alternate approaches. It follows that the architecture and/or components of memory card 100 are in no way intended to limit the invention, but rather have been presented as a non-limiting example.

Moreover, as an option, the present memory card 100 may be implemented in conjunction with features from any other approach listed herein, such as those described with reference to the other FIGS. However, such memory card 100 and others presented herein may be used in various applications and/or in permutations which may or may not be specifically described in the illustrative approaches listed herein. Further, the memory card 100 presented herein may be used in any desired environment.

With continued reference to FIG. 1, memory card 100 includes a gateway 102, a general purpose processor (GPP) 112 (such as an ASIC, FPGA, CPU, etc.) connected to a GPP memory 114 (which may comprise RAM, ROM, battery-backed DRAM, phase-change memory PC-RAM, MRAM, STT-MRAM, etc., or a combination thereof), and a number of memory controllers 108, which include Flash controllers in the present example. Each memory controller 108 is connected to a plurality of NVRAM memory modules 104 (which may comprise NAND Flash or other non-volatile memory type(s) such as those listed above) via channels 106.

According to various approaches, one or more of the controllers 108 may be or include one or more processors, and/or any logic for controlling any subsystem of the memory card 100. For example, the controllers 108 typically control the functions of NVRAM memory modules 104 such as, data writing, data recirculation, data reading, etc. The controllers 108 may operate using logic known in the art, as well as any logic disclosed herein, and thus may be considered as a processor for any of the descriptions of non-volatile memory included herein, in various approaches.

Moreover, the controller 108 may be configured and/or programmable to perform or control some or all of the methodology presented herein. Thus, the controller 108 may be considered to be configured to perform various operations by way of logic programmed into one or more chips, modules, and/or blocks; software, firmware, and/or other instructions being available to one or more processors; etc., and combinations thereof.

Referring still to FIG. 1, each memory controller 108 is also connected to a controller memory 110 which preferably includes a cache which replicates a non-volatile memory structure according to the various approaches described herein. However, depending on the desired approach, the controller memory 110 may be battery-backed DRAM, phase-change memory PC-RAM, MRAM, STT-MRAM, etc., or a combination thereof.

Figure 2:
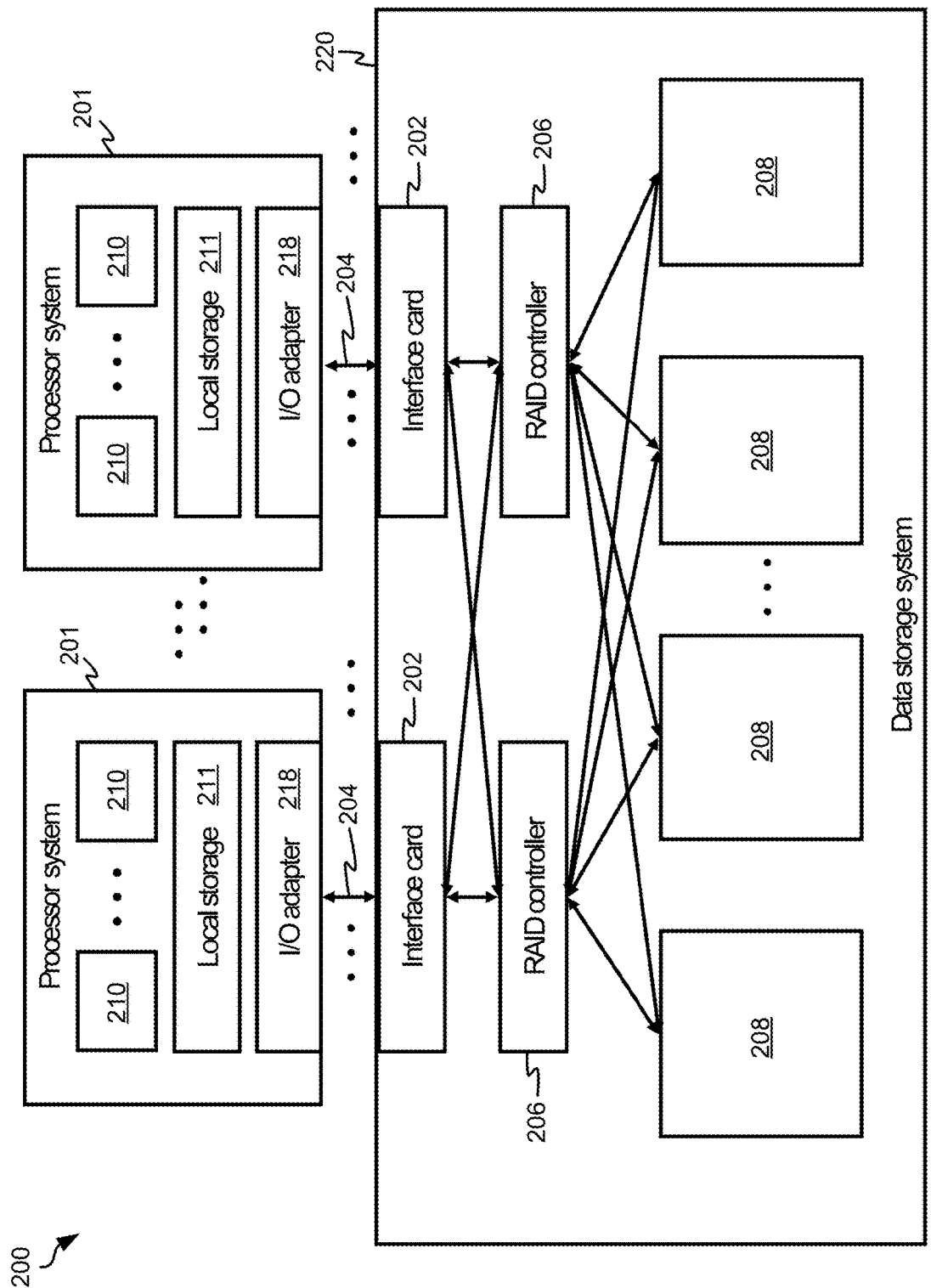
FIG. 2 is a diagram of a data storage system architecture, in accordance with one approach.

As previously mentioned, memory card 100 may be implemented in various types of data storage systems, depending on the desired approach. FIG. 2 illustrates a data storage system architecture 200 according to an exemplary approach which is in no way intended to limit the invention. Moreover, it should be noted that the data storage system 220 of FIG. 2 may include various components found in the approach of FIG. 1.

Looking to FIG. 2, the data storage system 220 comprises a number of interface cards 202 configured to communicate via I/O interconnections 204 to one or more processor systems 201. The data storage system 220 may also comprise one or more Redundant Array of Independent Disks (RAID) controllers 206 configured to control data storage in a plurality of non-volatile data storage cards 208. The non-volatile data storage cards 208 may comprise NVRAM, Flash memory cards, RAM, ROM, and/or some other known type of non-volatile memory.

The I/O interconnections 204 may include any known communication protocols, such as Fiber Channel (FC), FC over Ethernet (FCoE), Infiniband, Internet Small Computer System Interface (iSCSI), Transport Control Protocol/Internet Protocol (TCP/IP), Peripheral Component Interconnect Express (PCIe), etc., and/or any combination thereof.

The RAID controller(s) 206 in the data storage system 220 may perform a parity scheme similar to that employed by RAID-5, RAID-6, RAID-10, or some other suitable parity scheme, as would be understood by one of skill in the art upon reading the present descriptions.

Each processor system 201 comprises one or more processors 210 (such as CPUs, microprocessors, etc.), local data storage 211 (e.g., such as RAM 1014 of FIG. 10, ROM 1016 of FIG. 10, etc.), and an I/O adapter 218 configured to communicate with the data storage system 220.

Referring again to FIG. 1, memory controllers 108 and/or other controllers described herein (e.g., RAID controllers 206 of FIG. 2) may be able to perform various functions on stored data, depending on the desired approach. Specifically, memory controllers may include logic configured to perform any one or more of the following functions, which are in no way intended to be an exclusive list. In other words, depending on the desired approach, logic of a storage system may be configured to perform additional or alternative functions, as would be appreciated by one skilled in the art upon reading the present description.

Garbage Collection

Garbage collection in the context of SSD memory controllers of the present description may include the process of identifying blocks of data to be reclaimed for future usage and relocating all pages that are still valid therein. Moreover, depending on the specific controller and/or the respective garbage collection unit of operation, logical erase blocks (LEBs) may be identified for being reclaimed and/or relocated. Typically, one LEB corresponds to one block stripe, but alternative implementations may consider a fixed number of block stripes building a LEB as well.

A physical "block" represents a minimal unit that may be erased on non-volatile memory, e.g., such as NAND Flash memory, and thereby prepared for writing data thereto. However, a typical garbage collection unit of operation is often a multiple of the physical blocks of non-volatile memory, and is also referred to herein as a LEB. This is due to the fact that typically RAID-like parity information is added in LEBs. Therefore, in case of a page or block failure data can only be rebuilt when all blocks in the LEB are still holding data. Accordingly, the individual blocks from the garbage collection unit can only be erased either individually or in a single unit once all still valid data from all blocks in the LEB has been relocated successfully to new locations. Hence, the full garbage collection units are garbage-collected as a single unit. Moreover, the size of the LEB directly affects the garbage collection induced write amplification. The larger the LEB, the more likely it becomes that unrelated data are stored together in the LEB, and therefore more of the LEB data may have to be relocated upon garbage collection selection.

Frequently, blocks from different dies and/or Flash channels are grouped together, such that blocks from the same group can be read or written in parallel, thereby increasing overall bandwidth. It is also possible to combine the previous two methods, and to compose RAID stripes using blocks from different Flash channels that can be accessed in parallel.

It should also be noted that an LEB may include any multiple of the physical memory block, which is a unit of physical erasure. Moreover, the organization of memory blocks into LEBs not only allows for adding RAID-like parity protection schemes among memory blocks from different memory chips, memory planes and/or channels but also allows for significantly enhancing performance through higher parallelism. For instance, multiple non-volatile memory blocks may be grouped together in a RAID stripe. As will be appreciated by one skilled in the art upon reading the present description, RAID schemes generally improve reliability and reduce the probability of data loss.

According to an exemplary approach, which is in no way intended to limit the invention, memory controllers (e.g., see 108 of FIG. 1) may internally perform a garbage collection. As previously mentioned, the garbage collection may include selecting a LEB to be relocated, after which all data that is still valid on the selected LEB may be relocated (e.g., moved). After the still valid data has been relocated, the LEB may be erased and thereafter, used for storing new data. The amount of data relocated from the garbage collected LEB determines the write amplification. Moreover, an efficient way to reduce the write amplification includes implementing heat segregation.

Heat Segregation

In the present context, the "write heat" of data refers to the rate (e.g., frequency) at which the data is updated (e.g., rewritten with new data). Memory blocks that are considered "hot" tend to have a frequent updated rate, while memory blocks that are considered "cold" have an update rate slower than hot blocks.

Tracking the write heat of a logical page may involve, for instance, allocating a certain number of bits in the logical to physical table (LPT) mapping entry for the page to keep track of how many write operations the page has seen in a certain time period or window. Typically, host write operations increase the write heat whereas internal relocation writes decrease the write heat. The actual increments and/or decrements to the write heat may be deterministic or probabilistic.

Similarly, read heat may be tracked with a certain number of additional bits in the LPT for each logical page. To reduce meta-data, read heat can also be tracked at a physical block level where separate counters per block for straddling and non-straddling reads can be maintained. However, it should be noted that the number of read requests to and/or read operations performed on a memory block may not come into play for heat segregation when determining the heat of the memory block for some approaches. For example, if data is frequently read from a particular memory block, the high read frequency does not necessarily mean that memory block will also have a high update rate. Rather, a high frequency of read operations performed on a given memory block may denote an importance, value, etc. of the data stored in the memory block.

By grouping memory blocks of the same and/or similar write heat values, write heat segregation may be achieved. In particular, write heat segregating methods may group write hot memory pages together in certain memory blocks while write cold memory pages are grouped together in separate memory blocks. Thus, a write heat segregated LEB tends to be occupied by either write hot or cold data.

The merit of write heat segregation is two-fold. First, performing a garbage collection process on a write hot memory block will prevent triggering the relocation of write cold data as well. In the absence of heat segregation, updates to write hot data, which are performed frequently, also results in the undesirable relocations of all write cold data collocated on the same LEB as the hot data being relocated. Therefore, the write amplification incurred by performing garbage collection is much lower for approaches implementing write heat segregation.

Secondly, the relative write heat of data can be utilized for wear leveling purposes. For example, write hot data may be placed in healthier (e.g., younger) memory blocks, while write cold data may be placed on less healthy (e.g., older) memory blocks relative to those healthier memory blocks. Thus, the rate at which relatively older blocks are exposed to wear is effectively slowed, thereby improving the overall endurance of a given data storage system implementing write heat segregation.

Write Allocation

Write allocation includes placing data of write operations into free locations of open LEBs. As soon as all pages in a LEB have been written, the LEB is closed and placed in a pool holding occupied LEBs. Typically, LEBs in the occupied pool become eligible for garbage collection. The number of open LEBs is normally limited and any LEB being closed may be replaced, either immediately or after some delay, with a fresh LEB that is being opened.

During performance, garbage collection may take place concurrently with user write operations. For example, as a user (e.g., a host) writes data to a device, the device controller may continuously perform garbage collection on LEBs with invalid data to make space for the new incoming data pages. As mentioned above, the LEBs having the garbage collection being performed thereon will often have some pages that are still valid at the time of the garbage collection operation; thus, these pages are preferably relocated (e.g., written) to a new LEB.

Again, the foregoing functions are in no way intended to limit the capabilities of any of the storage systems described and/or suggested herein. Rather, the aforementioned functions are presented by way of example, and depending on the desired approach, logic of a storage system may be configured to perform additional or alternative functions, as would be appreciated by one skilled in the art upon reading the present description.

Referring now to FIG. 3, a system 300 is illustrated in accordance with one approach. As an option, the present system 300 may be implemented in conjunction with features from any other approach listed herein, such as those described with reference to the other FIGS. However, such system 300 and others presented herein may be used in various applications and/or in permutations which may or may not be specifically described in the illustrative approaches listed herein. Further, the system 300 presented herein may be used in any desired environment, e.g., in combination with a controller.

As illustrated, system 300 includes a write cache 302 which is coupled to several other components, including garbage collector 304. As previously mentioned, garbage collector 304 may be used to free LEB units by relocating valid data and providing non-volatile memory blocks to be erased for later reuse. Thus, the garbage collector 304 may reclaim blocks of consecutive physical space, depending on the desired approach. According to an exemplary approach, block erase units may be used to keep track of and/or complete the erase of non-volatile memory blocks handed over by the garbage collector 304.

Write cache 302 is also coupled to free block manager 306 which may keep track of free non-volatile memory blocks after they have been erased. Moreover, as would be appreciated by one of ordinary skill in the art upon reading the present description, the free block manager 306 may build free stripes of non-volatile memory blocks from different lanes (e.g., block-stripes) using the erased free non-volatile memory blocks.

Referring still to FIG. 3, write cache 302 is coupled to LPT manager 308 and memory I/O unit 310. The LPT manager 308 maintains the logical-to-physical mappings of logical addresses to physical pages of memory. According to an example, which is in no way intended to limit the invention, the LPT manager 308 may maintain the logical-to-physical mappings of 4 KiB logical addresses. The memory I/O unit 310 communicates with the memory chips in order to perform low level operations, e.g., such as reading one or more non-volatile memory pages, writing a non-volatile memory page, erasing a non-volatile memory block, etc.

To better understand the distinction between block-stripes and page-stripes as used herein, FIG. 4A is a conceptual diagram 400, in accordance with one approach. LEBs are built from block stripes and typically a single block stripe is used to build a LEB. However, alternative approaches may use multiple block stripes to form an LEB. As an option, the present conceptual diagram 400 may be implemented in conjunction with features from any other approach listed herein, such as those described with reference to the other FIGS. However, such conceptual diagram 400 and others presented herein may be used in various applications and/or in permutations which may or may not be specifically described in the illustrative approaches listed herein. Further, the controller conceptual diagram 400 presented herein may be used in any desired environment. Thus, the exemplary non-volatile memory controller conceptual diagram 400 of FIG. 4A may be implemented in a cache architecture. However, depending on the desired approach, the conceptual diagram 400 of FIG. 4A may be implemented in defining the organization of data stored in non-volatile memory. Accordingly, both implementations are described in turn below.

Non-Volatile Memory

Looking now to FIG. 4A, the conceptual diagram 400 includes a set of M+1 aggregated planes labeled "Plane 0" through "Plane M". An aggregated plane consists of all physical planes with the same plane index on different channels. It should be noted that aggregated planes are also referred to herein simply as planes.

When implemented with data stored in non-volatile memory, each physical plane on a channel may include a large set of blocks, e.g., typically in the order of 1024, 2048 or more. Moreover, one or more physical planes may also include several additional blocks which may be used as replacement blocks for bad blocks (e.g., blocks performing poorly, blocks having undesirable characteristics, etc.).

In each plane of non-volatile memory, a single block from each channel forms a respective block-stripe. It follows that a number of block-stripes supported by a given approach of non-volatile memory may be determined by the number of blocks per plane and the number of planes.

In the exploded view of Plane 0, the conceptual diagram 400 further illustrates a single block-stripe (Block-stripe 0) out of the set of block-stripes supported in the remainder of the planes. Block-stripe 0 of plane 0 is shown as including 11 blocks, one block from each channel labeled "Channel 0" through "Channel 10". It should be noted that the association of blocks to block-stripe can change over time as block-stripes are typically dissolved after they have been garbage collected. Erased blocks may be placed in free block pools, whereby new block-stripes are assembled from blocks in the free block pools when write allocation requests fresh block-stripes. For example, looking to conceptual diagram 400, Block 10 from Channel 0 and Block 41 from Channel 4 are currently associated with the illustrated Block-stripe 0 of Plane 0. Furthermore, the illustrated Block-stripe 0 holds N+1 page-stripes and each block therefore holds N+1 pages labeled "Page 0" through "Page N".

Cache Architecture

Referring still to FIG. 4A, each block of pages illustrated in the exploded view of aggregated Plane 0 may constitute a unique block from one channel when implemented in a cache architecture. Similarly, each channel contributes a single, individual block which form a block-stripe. For example, looking to conceptual diagram 400, Block 10 from Channel 0 includes all pages (Page 0 through Page N) therein, while Block 41 from Channel 4 corresponds to all pages therein, and so on.

In the context of a memory controller, e.g., which may be capable of implementing RAID at the channel level, a block-stripe is made up of multiple blocks which amount to a stripe of blocks. Looking still to FIG. 4A, the multiple blocks of aggregated Plane 0 constitute Block-stripe 0. While all blocks in a block-stripe typically belong to the same aggregated plane, in some approaches one or more blocks of a block-stripe may belong to different physical planes. It follows that each aggregated plane may include one or more block-stripe. Thus, according to an illustrative approach, Block 0 through Block 10 from different physical planes may constitute a block-stripe.

Regardless of whether the conceptual diagram 400 of FIG. 4A is implemented with non-volatile memory and/or a cache architecture, in different approaches, the number of pages in each block and/or the number of channels in each plane may vary depending on the desired approach. According to an exemplary approach, which is in no way intended to limit the invention, a block may include 1024 pages, but could include more or less in various approaches. Analogously, the number of channels per plane and/or the number of planes may vary depending on the desired approach.

Referring still to FIG. 4A, all pages in a block-stripe with the same page index denote a page-stripe. For example, Page-stripe 0 includes the first page (Page 0) of each channel in Block-stripe 0 of Plane 0. Similarly, Page-stripe N includes the last page (Page N) of each channel in Block-stripe 0 of Plane 0.

Figure 4B:
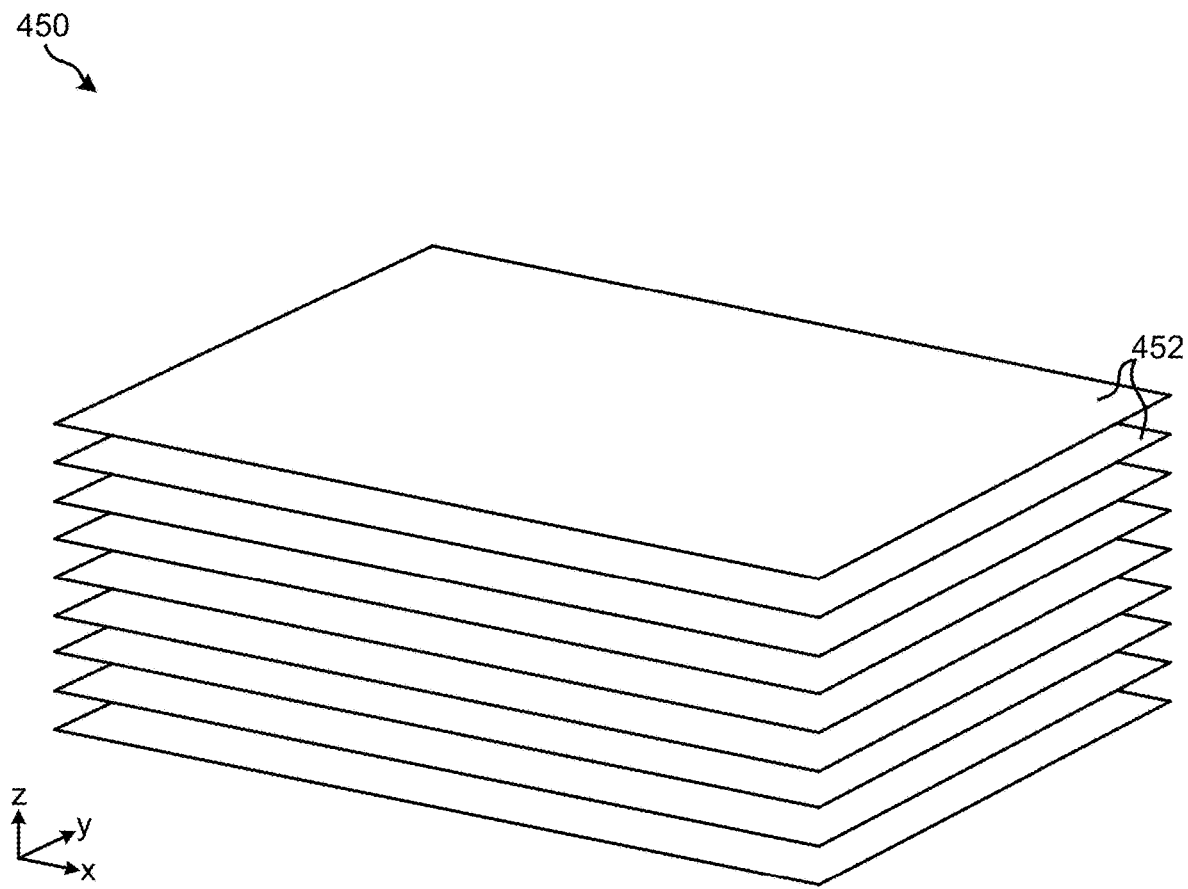
FIG. 4B is a partial perspective view of a 3-D non-volatile memory structure, in accordance with one approach.

The general storage architecture illustrated in the conceptual diagram 400 of FIG. 4A is also implemented by using 3-D memory structures in some approaches. For instance, FIG. 4B depicts a representational view of a 3-D non-volatile memory structure 450, in accordance with one approach. As an option, the present structure 450 may be implemented in conjunction with features from any other approach listed herein, such as those described with reference to the other FIGS., such as FIG. 4A. However, such structure 450 and others presented herein may be used in various applications and/or in permutations which may or may not be specifically described in the illustrative approaches listed herein. Further, the structure 450 presented herein may be used in any desired environment. Thus FIG. 4B (and the other FIGS.) may be deemed to include any possible permutation.

As shown, each layer 452 of the 3-D non-volatile memory structure 450 extends along both the x-axis and the y-axis. Each of these layers 452 include a plurality of storage components (not shown), such as voltage supply lines, sensor stacks, transistors, etc., which are used to implement the non-volatile memory devices of the general storage architecture illustrated in the conceptual diagram 400 of FIG. 4A, e.g., as would be appreciated by one skilled in the art after reading the present description. Moreover, the various layers 452 are arranged in a stacked fashion along the z-axis in order to increase storage density and efficiency. Cells from different bitlines along a word-line (typically in the x or y dimension of FIG. 4B) are logically combined to form pages. Thus, each block includes more than one word-line therein, and each word-line has more than one read voltage associated therewith. For example, in TLC, each word-line in a block contains 3 physical pages (e.g., a lower page, an upper page, and an extra page) and a word-line typically belongs to one particular layer in the z dimension (perpendicular to the x-y plane).

For a particular block, which is formed from a grid of cells connected by word-lines and bit-lines, the number of word-lines residing on the same layer is typically small. Therefore, a block can be formed from word-lines of all layers 452. Moreover, word-lines as well as pages in the same block may reside on different layers 452. It should also be noted that a block includes more than one type of page therein (e.g., upper page, lower page, extra page, top page), and at least one read voltage is associated with each of the page types, e.g., as would be appreciated by one skilled in the art after reading the present description.

Again, due to cycling, retention, read disturb, program disturb, etc., or other mechanisms that may be specific to the 3-D NAND Flash technology (e.g., floating gate based or charge trap based technology), process technology, cell and material design, circuit and array architecture, etc., or other specific design factors, the programmed threshold voltage distributions in the memory block may change with writing and erasing data (cycling), reading data (read disturb), time (retention), etc., in a relatively slow or fast manner. In other words, the RBER of Flash memory blocks increases with time and use. As memory blocks are used, each P/E cycle performed on the blocks causes damage of the memory cells, which in turn increases the corresponding RBER.

Block calibration is an important aspect of enhancing endurance and retention for Flash storage systems, e.g., particularly enterprise-level Flash systems, by reducing the RBER experienced. This block calibration corresponds to the read voltages and refers to algorithms that are able to track the changes of the threshold voltage distributions and adjust the read voltages accordingly, thereby significantly reducing the bit errors and improving the performance consistency in the respective device by reducing read tail latency which would otherwise result from error recovery mechanism invocations.

Moreover, adjustments to the read voltages are applied during a read command accordingly. It follows that the threshold voltage represents the voltage associated with turning on the transistor of a given Flash memory cell and its value depends on the amount of charge stored during programming. However, the read voltage is a bias voltage, the value of which is typically between the threshold voltage of two adjacent logical states, e.g., as is explained in further detail below in FIG. 5.

Figure 5:
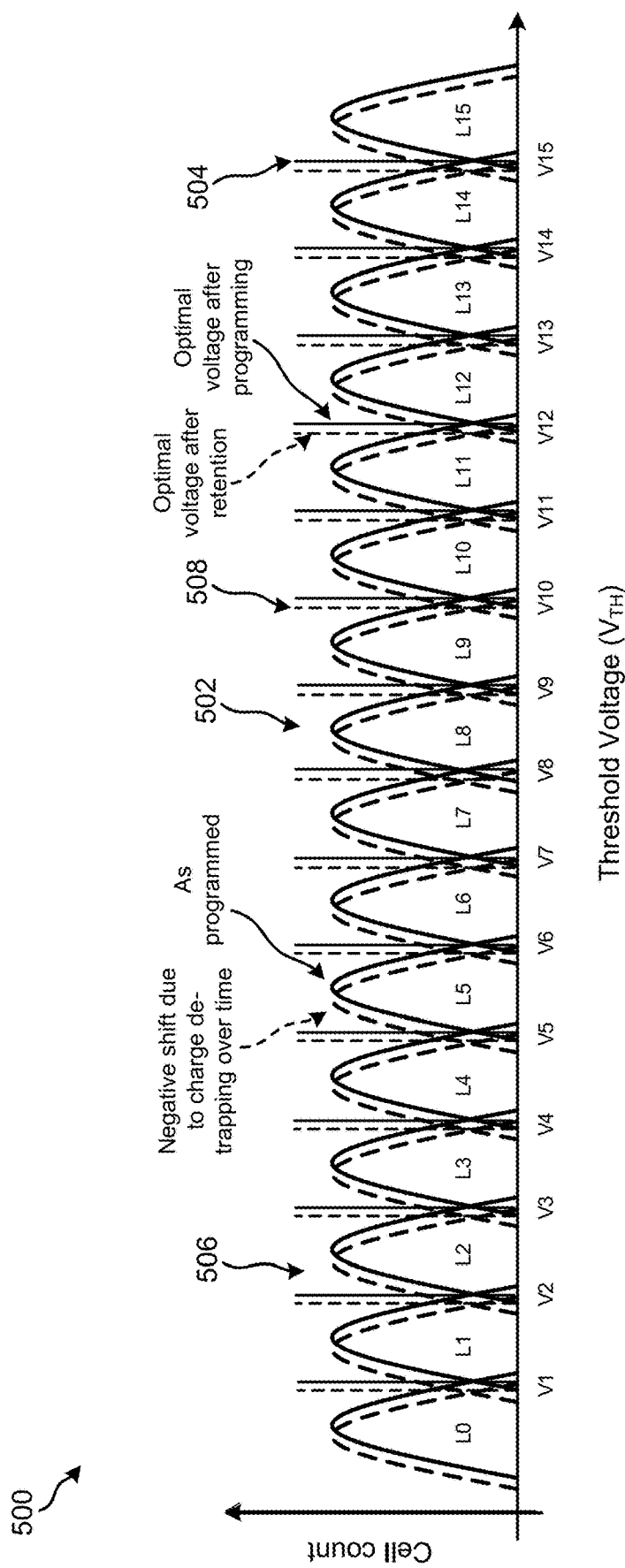
FIG. 5 is a graph which illustrates the threshold voltage shifting phenomenon, in accordance with one approach.

Referring momentarily to FIG. 5, a graph 500 illustrating the threshold voltage shifting phenomenon is illustrated in accordance with an example. The x-axis of the graph 500 represents the programmed threshold voltage $V_{TH}$, while the y-axis represents the corresponding cell count of a QLC NAND Flash memory block. In QLC NAND Flash memory, each memory cell stores 4 bits of information, therefore, the $V_{TH}$ distributions correspond to 16 possible discrete levels (L0, L1, ..., L15). Moreover, each different type of page in a given block of QLC NAND Flash has a different set of the read voltages which correspond thereto. According to an example, which is in no way intended to limit the invention, a lower page corresponds to the V8 read voltage, an upper page corresponds to the V4 and V12 read voltages, an extra page corresponds to the V2, V6, V10, and V14 read voltages, while a top page corresponds to the V1, V3, V5, V7, V9, V11, V13 and V15 read voltages.

The solid distributions 502 indicate the $V_{TH}$ levels after programming. The vertical solid lines 504 indicate the read voltages (V1, ..., V15) that are optimal for the $V_{TH}$ distributions 502. The dashed distributions 506 indicate a negative shift of the $V_{TH}$ levels due to charge loss over time. Because of this negative shift to lower voltages, the read voltages 504 are no longer optimal. Indeed, a negative offset must be applied to the read voltages in order to account for the changes of the $V_{TH}$ distributions from 502 to 506. The vertical dashed lines 508 indicate the read voltages (V1, ..., V15) that are optimal during retention for the $V_{TH}$ distributions in 506. In general, each of the 16 levels (L0, L1, ..., L15) shown in the figure may have a different $V_{TH}$ shift and thus, each of the 15 read voltages (V1, ..., V15) may have a different optimal shift.

Accordingly, the read voltage shift values (or offset values) are preferably determined shortly after a block has been written to and/or periodically thereafter. The threshold voltage can be considered an index of the cell programmed level (i.e., L0, L1, ..., L15), as determined by measuring the source-drain current when a control gate bias is applied to the memory cell. Typically, upon a read operation, one or more read voltages between adjacent nominal threshold voltage levels are used to determine the memory cell state. As the threshold voltage value of the memory cell changes (as explained above), the read voltages applied during a read operation are preferably shifted accordingly using a set of offset values to obtain optimal readout conditions and minimize the RBER. Subsequently, the optimal read voltage shift values may be updated periodically, e.g., in a background health check, or on demand, e.g., in the event of high bit error count or ECC failure.

Although increases to RBERs are irreparable for some blocks (e.g., such as those caused by prolonged P/E cycles), increases to RBERs caused by events such as retention and/or read disturbances are transient in the sense that the blocks which are affected are not irreversibly damaged. This unfavorable increase in RBERs is remedied when the corresponding memory blocks are recalibrated such that the corresponding read voltages are corrected. In other approaches, blocks experiencing transient RBER increases may be remedied by being erased, programmed, and recalibrated. It is therefore apparent that the RBER of the block depends on the state of the block, which may be determined by the cycling state, the retention state, the read disturb state and/or any combinations thereof. Block recalibration improves the RBER by adjusting the read voltages so that they are optimal under the various changes of the $V_{TH}$ distributions under permanent effects and/or transient effects.

Ideally, the read voltages for each page in a block of memory are updated individually. However, as the storage capacity of memory increases, the amount of storage consumed by maintaining a read voltage offset value for each page in each block of memory increases as well. For instance, advancing from 3 bits per cell in TLC NAND Flash memory to 4 bits per cell in QLC NAND Flash memory, each block implements 16 threshold voltage levels (instead of 8 in TLC), and 15 different read voltages (instead of 7 in TLC) to read any of the pages included therein. Moreover, with the improvements in vertical stacking and process technology, the number of layers in every new generation of 3-D NAND Flash increases as well. Subsequently, the number of pages in each block also increases. For example, current 3-D QLC NAND Flash memory may have more than 90 layers and each block may have more than 4000 pages. Thus, if all of these 15 different read voltages in 3-D QLC NAND are calibrated independently (or individually), the amount of metadata involved with storing an individual set of read offset values for each page, or group of pages, in a block and the number of calibration reads per page increases significantly.

As the storage capacity of memory continues to increase, reliability issues associated with the memory increase as well. As a result, conventional calibration engines have experienced an increasing amount of processing overhead caused by the declining reliability of the memory in addition to the increasing number of read voltage offset values that are associated with each page in each block of memory.

In sharp contrast to the increasingly inefficient manner in which conventional storage systems have managed memory performance, various ones of the approaches included herein are able to significantly reduce calibration overhead while also improving read performance. These improvements are achieved in some approaches as a result of reducing the number of read operations that are performed in the memory calibration process, e.g., as will be described in further detail below.

Figure 6A:
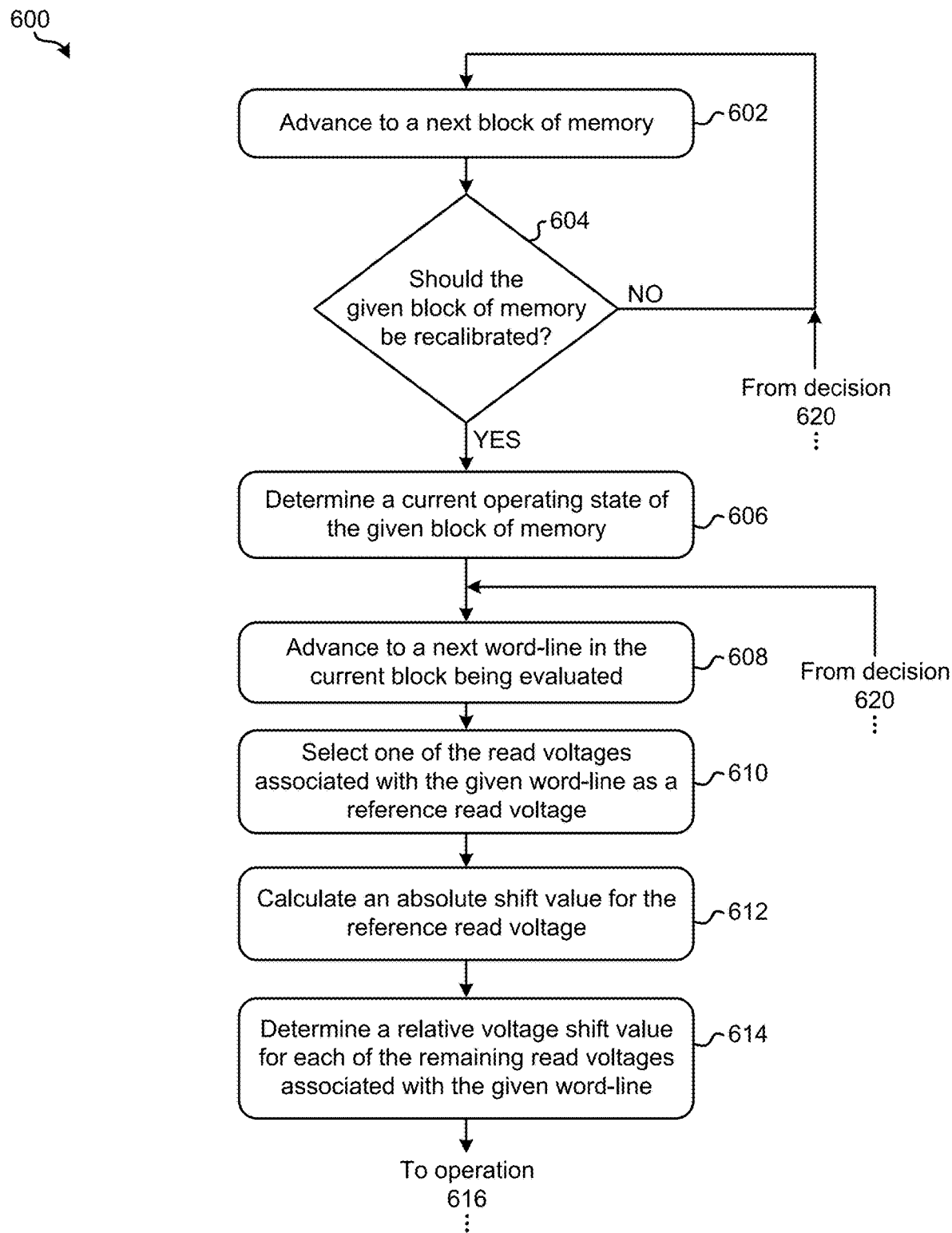
FIG. 6A is a flowchart of a method, in accordance with one approach.
Figure 6A:
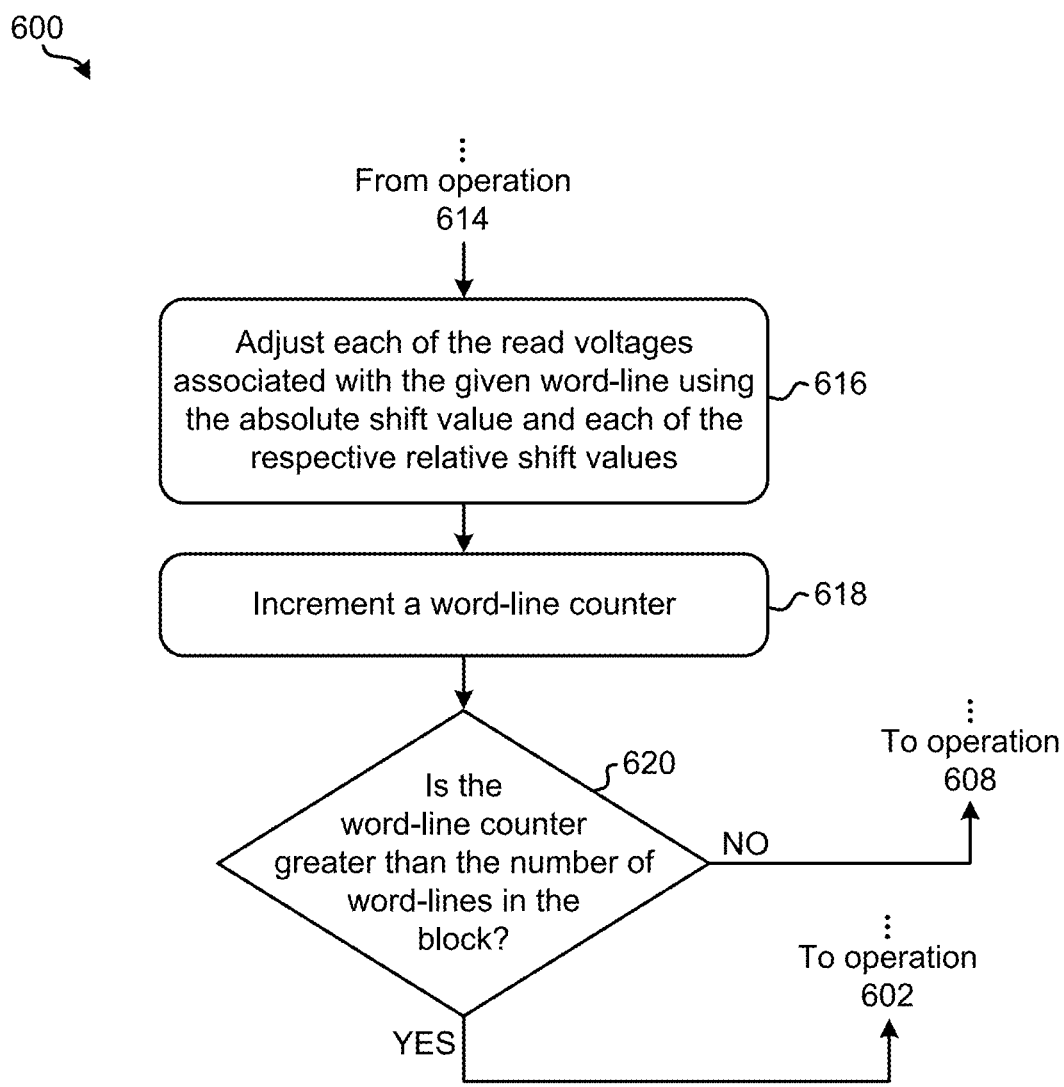

Referring now to FIG. 6A, a flowchart of a method 600 for calibrating read voltages for a block of memory configured in multi-bit-per-cell mode is illustrated in accordance with one approach. The method 600 may be performed in accordance with the present invention in any of the environments depicted in FIGS. 1-5, among others, in various approaches. For instance, any of the processes included in method 600 may be performed with respect to blocks of storage space in NVRAM, e.g., such as 3-D TLC NAND Flash, 3-D QLC NAND Flash, etc., or any other desired type of memory. Furthermore, more or less operations than those specifically described in FIG. 6A may be included in method 600, as would be understood by one of skill in the art upon reading the present descriptions.

Each of the steps of the method 600 may be performed by any suitable component of the operating environment. For example, in various approaches, the method 600 may be partially or entirely performed by a controller (e.g., Flash controller), a processor, a computer, etc., or some other device having one or more processors therein. Thus, in some approaches, method 600 may be a computer-implemented method. It should also be noted that the terms computer, processor and controller may be used interchangeably with regards to any of the approaches herein, such components being considered equivalents in the many various permutations of the present invention.

Moreover, for those approaches having a processor, the processor, e.g., processing circuit(s), chip(s), and/or module(s) implemented in hardware and/or software, and preferably having at least one hardware component may be utilized in any device to perform one or more steps of the method 600. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 6A, operation 602 of method 600 includes advancing to a next block of memory. With respect to the present description, "a next block of memory" may vary depending on the given approach. For instance, upon initiating method 600, a next block of memory may simply be a first block of memory. In other approaches, a next block of memory may be a next logical block of memory. Moreover, operation 602 may progress between the blocks of memory in any desired manner, e.g., sequentially, randomly, using a pattern, etc. Moreover, operation 602 may be triggered periodically, e.g., every 1 week, by a background process that examines all the NAND blocks, or may be triggered on demand, e.g., in the event of a page read in a block exhibiting a high bit error count or an ECC failure. Moreover, the memory preferably includes NVRAM. For instance, in some approaches the memory includes 3-D TLC NAND Flash, while in other approaches the memory includes 3-D QLC NAND Flash.

Decision 604 further includes determining whether the given block of memory should be recalibrated. In some approaches, criteria may be implemented which identify when and if a particular block should be recalibrated. For example, a block may be recalibrated after experiencing a predetermined number of P/E cycles (e.g., 500 P/E cycles), experiencing an undesirably low performance metric (e.g., the number of bit errors exhibiting a predetermined error count threshold), a predetermined amount of time has passed since a last recalibration, etc. This allows for some reduction in the amount of computing overhead experienced, e.g., as would be appreciated by one skilled in the art after reading the present description.

In response to determining that the given block of memory should not be recalibrated for whatever reason, method 600 returns to operation 602 whereby a next block is advanced to before repeating decision 604. However, in response to determining that the given block of memory should be recalibrated, method 600 proceeds to operation 606. There, operation 606 includes determining a current operating state of the given block of memory.

This operating state may be determined based on various types of available information, e.g., including statistics which corresponds to the block. For example, block statistics including a P/E cycling counter value, a read-disturb counter value, an amount of retention time maintained by a retention timer, an open/closed block state, i.e., whether the given block is partially or fully programmed, a number of programmed pages in the block, an operating temperature, etc., may be used to determine the current operating state of the block. An illustrative list of current operating states a given block of memory may be experiencing includes, but is in no way limited to, a retention state, a read-disturb state, a cycling state, an open and/or closed state (e.g., if part or all of the pages in the block have been programmed), etc., and/or any combination thereof.

The operating state a given block may be experiencing can provide information which describes the status of the threshold voltages (L0-L15 in FIG. 5) and therefore the adjustment required for the respective read voltages (V1-V15 in FIG. 5) which correspond to the given block. This is primarily because the threshold voltages for a given word-line experience similar wear mechanisms when exposed to the same or similar operating conditions, e.g., at least with respect to each other, and thus the respective read voltages require a similar shift or adjustment. In other words, each of the threshold voltages for a given word-line will experience a respective shift in response to being subjected to a given set of operating conditions. While these shifts are typically not the same value for each of the threshold voltages in the same word-line, the relative differences therebetween is predictably repeatable. For instance, each subsequent time a word-line encounters the same or a similar set of operating conditions, it can be predicted that the relative threshold voltage shifts experienced by each respective threshold voltage, and therefore the relative read voltage shifts to account for the threshold voltage shifts, will be the same as previously encountered.

According to an example, which is in no way intended to limit the invention, testing performed on a given block B reveals that a first read voltage experiences a shift of −4, a second read voltage experiences a shift of −8, and a third read voltage experiences a shift of −2 when in a particular operating state S1. The relationship between each of these shift values may thereby be stored in memory, indicating that for operating state S1, block B reacts such that the first read voltage experiences a shift that is ½ that of the second read voltage, and the third read voltage experiences a shift that is ¼ that of the second read voltage. Thus, the next time block B experiences operating state S1, it may be predicted that the first, second, and third read voltages will experience the same relative shifts without performing any calibrations, computations, etc. Similarly, another block C having the same operating state S1 may also benefit from a prediction that the first, second, and third read voltages thereof will experience the same relative shifts that block B experienced without performing any calibrations, computations, etc.

It follows that a block may be tested under a number of different operating states in order to determine the relative changes that occur to each of the read voltages thereof. These relative changes may also be stored in memory (e.g., as a predetermined voltage mapping in a lookup table) such that the read voltages shift values for a block which is in a same or similar operating state may simply be extracted from memory, e.g., as will be described in further detail below. Although the relative read voltage shifts may be stored in memory for future use, these read voltage shifts are only represented relative to each other. Thus, the relative read voltage shifts are unable to determine any of the actual read voltage shift values which have been experienced. However, by calculating the actual read voltage shift value for one read voltage, the relative read voltage shifts may be used to extrapolate the actual read voltage shift values for the remainder of the read voltages, e.g., as will soon become apparent.

Returning again to FIG. 6A, method 600 proceeds to operation 608 from operation 606. There, operation 608 includes advancing to a next word-line in the current block being evaluated. As previously mentioned, "a next word-line" may vary depending on the given approach. For instance, a next word-line of the block may simply be a first word-line during an initial iteration of operation 608. In other approaches, a next word-line may be a next logical word-line in the block. Moreover, operation 608 may progress between the word-lines in any desired manner, e.g., sequentially, randomly, using a pattern, etc.

Operation 610 further includes selecting one of the read voltages associated with the given word-line as a reference read voltage, while operation 612 includes calculating an absolute shift value for the reference read voltage. As mentioned above, by calculating the actual read voltage shift value (here the "absolute shift value") for one read voltage (here the "reference read voltage"), the relative read voltage shifts may be used to extrapolate the actual read voltage shift values for the remainder of the read voltages.

Any one of the read voltages associated with the given word-line may be selected as the reference read voltage, e.g., depending on the desired approach. For instance, in some approaches a right-most read voltage (e.g., the highest read voltage) may be selected as the reference read voltage, while in other approaches a left-most read voltage (e.g., the lowest read voltage) may be selected as the reference read voltage. In still other approaches, a random one of the read voltages for the word-line, a read voltage predicted to experience a greatest voltage shift value for the word-line, a read voltage selected by a user, etc., may be selected as the reference read voltage. The absolute shift value for the reference read voltage may also be calculated using any processes which would be apparent to one skilled in the art after reading the present description.

Proceeding to operation 614, method 600 includes determining a relative voltage shift value for each of the remaining read voltages associated with the given word-line. As mentioned above, the relative shift values for the read voltages associated with a given word-line are preferably known based on testing, modeling, analyzing past performance, etc. It follows that the absolute shift value for the reference read voltage can be used in combination with the relative shift values to extrapolate the actual read voltage shift values for the remainder of the read voltages. In other words, the relative shift values are determined with respect to the reference read voltage.

In some approaches, the relative shift values are incorporate in a predetermined voltage mapping. The predetermined voltage mapping correlates the relative shift values to each of the respective read voltages for a given operating state of the overarching block. For instance, referring momentarily to FIG. 8A, table 800 depicts an illustrative voltage mapping. As shown, each operating state s1, s2, ..., sN has a number of relative shift values (e.g., a(2,5)) which correspond thereto. Each of the relative shift values are further correlated with a respective read voltage (e.g., V5).

It follows that relative shift values for a given word-line may be determined for the remaining read voltages in operation 614 of method 600 using a predetermined voltage mapping which corresponds to the current operating state of the block. For instance, the current operating state of the block currently being calibrated may be matched with a corresponding one of a number of predetermined operating states, e.g., as seen in table 800 of FIG. 8A. Moreover, the relative shift values may simply be extracted from the predetermined voltage mapping which is assigned to the matching predetermined operating state. This ultimately allows for the voltage shift values for all of the read voltages associated with the given word-line to be determined as a result of only calculating one of the shift values, e.g., as will be described in further detail below. This significantly reduces processing overhead and performance delays, while also ensuring high read performance and efficient memory usage.

With continued reference to FIG. 6A, operation 616 includes adjusting each of the read voltages associated with the given word-line using the absolute shift value and each of the respective relative shift values. As mentioned above, the relative shift values are relative to the absolute shift value calculated for the reference read voltage. Thus, each of the read voltages (other than the reference read voltage) may be adjusted by applying the respective relative shift value to the absolute shift value, and applying the resulting shift value to the given read voltage.

Returning to the example presented above regarding block B, the second read voltage may be designated as the reference read voltage. As a result, an absolute shift value of −8 would be calculated for the second read voltage, indicating that a shift of −8 should be applied to the read voltage thereof. Using this absolute shift value of −8, the relative shift value of ½ for the first read voltage and ¼ for the third read voltage dictate that an actual shift value of −4 should be applied to the first read voltage, while an actual shift value of −2 should be applied to the third read voltage.

In some approaches, the absolute shift value is also applied to the reference read voltage in operation 616. However, in other approaches the absolute shift value may be applied to the reference read voltage as a part of performing the calculation in operation 612 above. The absolute shift value and/or the other resulting shift values may be applied to the respective read voltages in way which would be apparent to one skilled in the art after reading the present description. For instance, in some approaches the shift values may be stored in memory, sent to a memory controller for application, used to actually adjust the respective read voltages, etc.

From operation 616, method proceeds to operation 618 which includes incrementing a word-line counter. As mentioned above, method 600 is preferably used to calibrate various blocks in memory, in addition to each word-line in each of the blocks that are calibrated. It follows that the word-line counter may be used to keep track of how many word-lines in the given block have been evaluated. It should also be noted that the word-line counter may be incremented by any desired unit, e.g., depending on the approach. Moreover, the word-line counter is preferably reset to a base value (e.g., 0) for each block that is calibrated.

Proceeding to decision 620, a determination is made as to whether the word-line counter is greater than the number of word-lines that are included in the block presently being calibrated. In other words, decision 620 determines whether each of the word-lines in the present block have been evaluated. In response to determining that the word-line counter is not greater than the number of word-lines that are included in the block, method 600 returns to operation 608 such that a next word-line may be evaluated, e.g., as described above. It follows that processes 608-620 may be repeated in an iterative fashion for each word-line in a block.

Returning to decision 620, method 600 returns to operation 602 in response to determining that the word-line counter is greater than the number of word-lines that are included in the block. In other words, method 600 returns to operation 602 such that a next block may be calibrated. It follows that processes 602-620 may be repeated in an iterative fashion for each block in memory. As a result, the various processes in method 600 are able to significantly reduce the calibration overhead experienced, particularly in comparison to conventional processes which can experience several hundred percent more calibration overhead.

While method 600 involves calculating an absolute shift value for one reference read voltage in each of the word-lines, similar improvements may be achieved as a result of further dividing the read voltages in a given word-line based on page type. For instance, looking now to FIG. 6B, another method 650 for calibrating read voltages for a block of memory configured in multi-bit-per-cell mode is illustrated in accordance with one approach. However, it should be noted that method 650 of FIG. 6B includes variations of method 600 from FIG. 6A, depicting several exemplary configurations of the process for calibrating read voltages for a block of memory. Accordingly, various processes of FIG. 6B have common numbering with those of FIG. 6A. Thus, any one or more of the processes included in method 650 may implement any one or more of the approaches described above with respect to those processes included in method 600.

Method 650 may be performed in accordance with the present invention in any of the environments depicted in FIGS. 1-5, among others, in various approaches. For instance, any of the processes included in method 650 may be performed with respect to blocks of storage space in NVRAM, e.g., such as 3-D TLC NAND Flash, 3-D QLC NAND Flash, etc., or any other desired type of memory. Furthermore, more or less operations than those specifically described in FIG. 6B may be included in method 650, as would be understood by one of skill in the art upon reading the present descriptions.

Each of the steps of the method 650 may be performed by any suitable component of the operating environment. For example, in various approaches, the method 650 may be partially or entirely performed by a controller (e.g., Flash controller), a processor, a computer, etc., or some other device having one or more processors therein. Thus, in some approaches, method 650 may be a computer-implemented method. It should also be noted that the terms computer, processor and controller may be used interchangeably with regards to any of the approaches herein, such components being considered equivalents in the many various permutations of the present invention.

Moreover, for those approaches having a processor, the processor, e.g., processing circuit(s), chip(s), and/or module(s) implemented in hardware and/or software, and preferably having at least one hardware component may be utilized in any device to perform one or more steps of the method 650. Illustrative processors include, but are not limited to, a central processing unit (CPU), an application specific integrated circuit (ASIC), a field programmable gate array (FPGA), etc., combinations thereof, or any other suitable computing device known in the art.

Figure 6B:
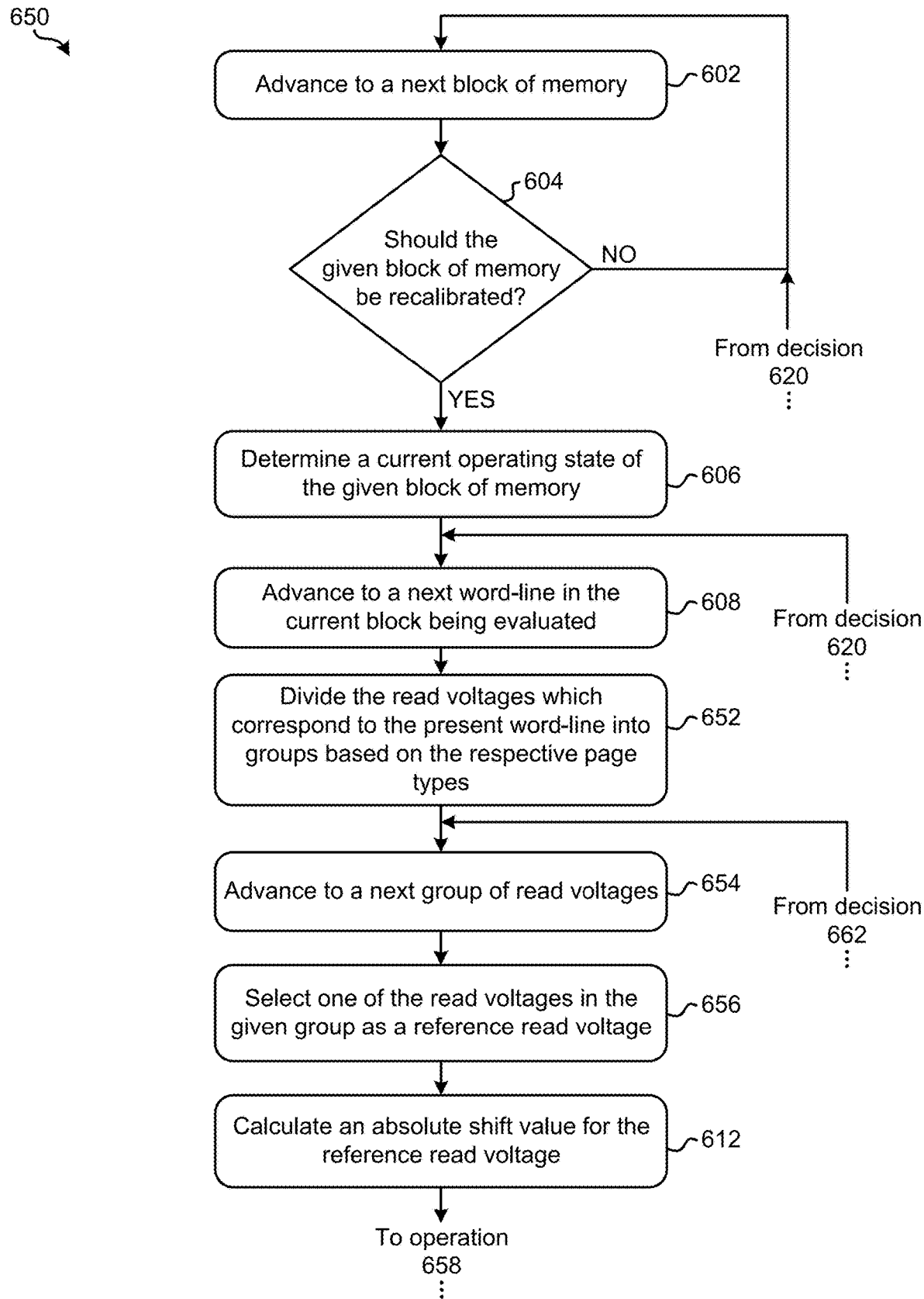
FIG. 6B is a flowchart of a method, in accordance with one approach.
Figure 6B:
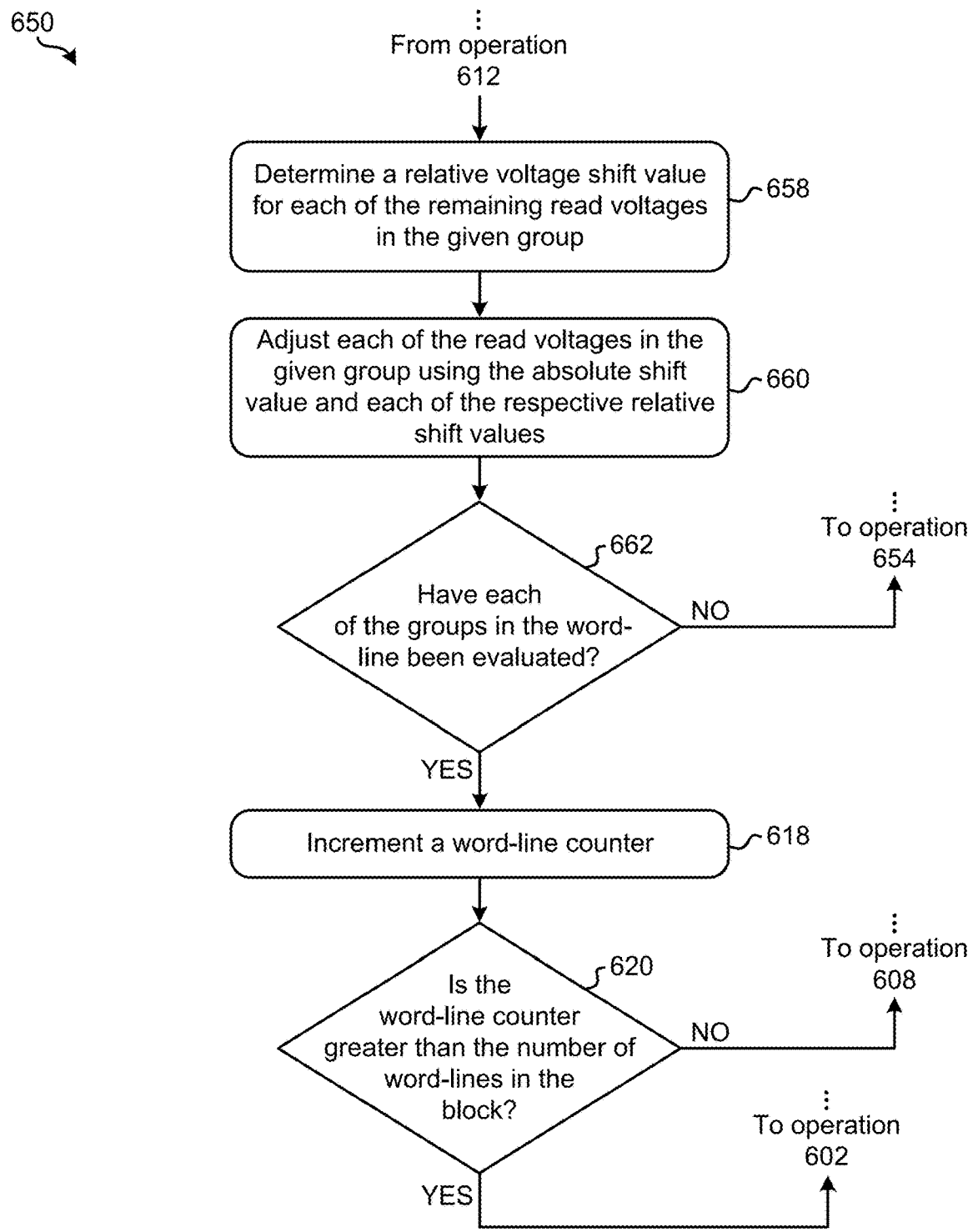

As shown in FIG. 6B, operation 602 of method 650 includes advancing to a next block of memory. As noted above, with respect to the present description, "a next block of memory" may vary depending on the given approach. From operation 602, method 650 proceeds to decision 604 which determines whether the given block of memory should be recalibrated.

In response to determining that the given block of memory should not be recalibrated for whatever reason, method 650 returns to operation 602 whereby a next block is advanced to before repeating decision 604. However, in response to determining that the given block of memory should be recalibrated, method 650 proceeds to operation 606. There, operation 606 includes determining a current operating state of the given block of memory, e.g., according to any of the approaches described above. Moreover, operation 608 includes advancing to a next word-line in the current block being evaluated. As previously mentioned, "a next word-line" may vary depending on the given approach.

Method 650 further includes dividing the read voltages which correspond to the present word-line into groups based on the respective page types. See operation 652. The read voltages are preferably divided such that each of the read voltages in a given group correspond to a same page type. For example, each of the read voltages in a first group may correspond to top pages in the given word-line, while each of the read voltages in a second group may correspond to extra pages in the given word-line. The groups may be designated differently depending on the approach. For instance, in some approaches each of the read voltages may be assigned to a given group by setting a corresponding flag, listing the read voltages in one or more different tables, assigning identifiers to the read voltages, etc.

In response to dividing the read voltages into a number of groups based on page types, each of the groups are preferably evaluated individually and/or in parallel before progressing to the next word-line. Accordingly, operation 654 includes advancing to a next group of read voltages. As mentioned above, the "next" group of read voltages may simply be a first group, a next group, a last group, a random one of the groups, etc., depending on the desired approach.

From operation 654, method 650 proceeds to operation 656 which further includes selecting one of the read voltages in the given group as a reference read voltage. As mentioned above, any one of the read voltages in the given group may be selected as the reference read voltage, e.g., depending on the desired approach. For instance, in some approaches a first read voltage in the group may be selected as the reference read voltage, while in other approaches a left-most read voltage (e.g., the lowest read voltage) in the group may be selected as the reference read voltage. In still other approaches, a random one of the read voltages in the group, a read voltage predicted to experience a greatest voltage shift value for the group, a read voltage selected by a user, etc., may be selected as the reference read voltage.

Operation 612 further includes calculating an absolute shift value for the reference read voltage, while operation 658 includes determining a relative voltage shift value for each of the remaining read voltages in the given group. It follows that any one or more of the approaches described above with respect to operation 614 may be modified and/or implemented as-is in order to perform operation 658 for the remaining read voltages in the given group, e.g., as would be appreciated by one skilled in the art after reading the present description.

For instance, in preferred approaches the relative voltage shift value for each of the remaining read voltages in the given group is determined by matching the current operating state of the block and the type of pages in the given group with a corresponding one of a number of predetermined operating states. Moreover, the relative shift values are preferably extracted from the predetermined voltage mapping which is assigned to the matching predetermined operating state and which corresponds to the type of pages in the given group. It follows that the specific page type which corresponds to the given group has an effect on the relative voltage shift values that are determined. Referring momentarily to FIG. 8B, tables 830, 840, 850, 860 depict illustrative voltage mappings, each of which correspond to a different page type. It follows that each of the tables 830, 840, 850, 860 may correspond to a different group of page types for the given word-line. As shown, each operating state s1, s2, . . . , sN for each page type LP, UP, XP, TP has a number of relative shift values (e.g., a(2,5) in table 860) which correspond thereto. Each of the relative shift values are further correlated with a respective read voltage (e.g., V5 in table 860).

As noted above, relative shift values for a given group of pages may be determined for the remaining read voltages in operation 658 of method 650 using a predetermined voltage mapping which corresponds to the current operating state of the block as well as the type of pages in the given group. For instance, the current operating state of the block currently being calibrated may be matched with a corresponding one of a number of predetermined operating states. The predetermined operating state may further have more than one voltage mappings associated therewith, where each of the voltage mappings corresponds to a different one of the page types, e.g., as seen in tables 830, 840, 850, 860 of FIG. 8B. Moreover, the relative shift values may simply be extracted from the predetermined voltage mapping which is assigned to the matching predetermined operating state and page type. This ultimately allows for the voltage shift values for all of the read voltages associated with the given group to be determined as a result of actually calculating only one of the shift values, e.g., as will be described in further detail below. This significantly reduces processing overhead and performance delays, while also ensuring high read performance and efficient memory usage.

With continued reference to FIG. 6B, operation 660 includes adjusting each of the read voltages in the given group using the absolute shift value and each of the respective relative shift values. As mentioned above, the relative shift values are relative to the absolute shift value calculated for the reference read voltage of the given group. Thus, each of the read voltages in the group (other than the reference read voltage) may be adjusted by applying the respective relative shift value to the absolute shift value, and applying the resulting shift value to the given read voltage. Again, it follows that any one or more of the approaches described above with respect to operation 616 may be modified and/or implemented as-is in order to perform operation 660, e.g., as would be appreciated by one skilled in the art after reading the present description.

From operation 660, method 650 proceeds to decision 662 which determines whether each of the groups which correspond to the current word-line have been evaluated. In response to determining that at least one of the groups have not yet been evaluated, method 650 returns to operation 654 such that a next group of read voltages may be advanced to. It follows that processes 654-662 as included in method 650 may be repeated in an iterative fashion for each group in the word-line.

However, in response to determining that each of the groups which correspond to the current word-line have been evaluated, method 650 advances to operation 618. There, operation 618 includes incrementing a word-line counter. Again, method 650 is preferably used to calibrate various blocks in memory, in addition to each word-line in each of the blocks that are calibrated. It follows that the word-line counter may be used to keep track of how many word-lines in the given block have been evaluated. Thus, proceeding to decision 620, a determination is made as to whether the word-line counter is greater than the number of word-lines that are included in the block presently being calibrated. In response to determining that the word-line counter is not greater than the number of word-lines that are included in the block, method 650 returns to operation 608 such that a next word-line may be evaluated, e.g., as described above. It follows that processes 608-620 as included in method 650 may be repeated in an iterative fashion for each word-line in a block.

Looking again to decision 620, method 650 returns to operation 602 in response to determining that the word-line counter is greater than the number of word-lines that are included in the block. In other words, method 650 returns to operation 602 such that a next block may be calibrated. It follows that processes 602-620 as included in method 650 may be repeated in an iterative fashion for each block in memory.

The various processes in method 650 are also able to significantly reduce the calibration overhead experienced, particularly in comparison to conventional processes which can experience several hundred percent more calibration overhead.

While methods 600 and 650 implement different levels of granularity in terms of how the read voltages shift values are determined, in some approaches the two methods may be combined into a single process. For example, a method (not shown) may include a decision which determines whether to evaluate read voltages on the word-line level or the specific page type level. In other words, a method may be implemented which determines which of the calibration policies discussed above should be implemented for a given block, e.g., depending on user input, system settings, performance metrics, etc.

Looking now to FIG. 7, as mentioned above, table 700 presents a number of exemplary operating states (e.g., see $s_2$) that a given block of memory may currently be experiencing. As shown, each of the states listed in the "States" column correspond to certain values for a number of different types of statistics. According to an example, state $S_{k+1}$ corresponds to a block which has experienced between 0 and 1000 P/E cycles, between 0 and 24 hours of retention time, 0 read-disturb cycles, and the operating temperature of the system is 40° C. It follows that any block determined as having statistics which match the foregoing ranges and values may be identified as having a current operating state of $s_{k+1}$. Once the current operating state of a block is matched with one of the predetermined operating states, the predetermined operating state can further be used to identify predetermined relative shift values for the read voltages of the block being evaluated, e.g., see FIGS. 8A-8B below. As it will be appreciated by those skilled in the art, table 700 may include a number of different operating states for different values or ranges of P/E cycles, retention time, read-disturb cycles, operating temperature, or other statistics.

With continued reference to FIG. 7, it is preferred that a number of block operating states are predetermined for the various blocks, word-lines, page types, etc., of a given storage system. For example, the plurality of block operating states illustrated in table 700 of FIG. 7 may be predetermined for a certain type of memory, a particular product, a specific user, etc. depending on the approach. Moreover, these block operating states may be predetermined using testing, modeling, manufacturer specifications, past performance information, etc.

As noted above, each of these operating states may further be correlated with particular relative shift values for the read voltages associated with the block being evaluated. For instance, looking to FIG. 8A, the table 800 includes an illustrative voltage mapping. Each of the operating states s1, s2, . . . , sN may be selected from a table such as that illustrated in FIG. 7 in response to comparing the current operating state of a block with predetermined operating states. Table 800 of FIG. 8A may thereby be used to identify a number of relative shift values (e.g., a(2,5)) which correspond to the specific operating state the block is experiencing. Each of the relative shift values are further correlated with a respective read voltage (e.g., V5), and may thereby be used to calculate the actual read voltage shift values for a majority of the read voltages, e.g., according to any of the approaches included herein.

FIG. 8B also includes tables 830, 840, 850, 860, each of which include a voltage mapping which corresponds to a specific page type. Thus, tables 830, 840, 850, 860 may be used in a similar manner to table 800 of FIG. 8A in order to determine relative shift values for various read voltages which correspond to pages of a same type, e.g., such as extra pages "XP". Each of the relative shift values are further correlated with a respective read voltage (e.g., V5 in table 860), and may thereby be used to calculate the actual read voltage shift values for a majority of the read voltages associated with the given page type, e.g., according to any of the approaches included herein. For instance, the relative voltage shift value for each of a number of read voltages in a given group is determined by matching the current operating state of the block and the type of pages in the given group with a corresponding one of a number of predetermined operating states (e.g., see FIG. 7). Thereafter, the relative shift values are preferably extracted from the predetermined voltage mapping which is assigned to the matching predetermined operating state and which corresponds to the type of pages in the given group.

It should be noted that although specific ones of the read voltages have been identified in each of tables 830, 840, 850, 860 as the reference voltage "reference", this is in no way intended to be limiting. As noted above, any of the read voltages in a given group may be selected as the reference voltage, e.g., depending on the desired approach.

It follows that the various approaches included herein are able to determine the voltage shift values for all of the read voltages associated with a given word-line and/or group of pages as a result of actually calculating only one of the voltage shift values. This significantly reduces processing overhead and performance delays, while also ensuring high read performance and efficient memory usage. As noted above, these significant improvements are achieved as a result of implementing processes which are able to recognize that the relative shift between the read voltages is retained with certain boundaries of the device operating states. Some of the approaches included herein are further able to recognize that the absolute shift value of the voltages is changing, but the relative shift values are still retained within the above boundaries. Thus, the relative shift values may be decoupled from the absolute shift value by mapping the relative voltage shifts values with the respective reference voltages. By determining the current operating state of a block, a determination may be made as to whether the given block is in the aforementioned boundaries, where the relative shift values of the voltages is retained. The reference voltages may also be used to periodically track the changes of the absolute shift values during the different operating states the block may experience.

According to an in-use example, which is in no way intended to limit the invention, the threshold voltage shifting illustrated in FIG. 5 corresponds to 3D QLC NAND with $i=0, 1, \ldots, 15$ voltage threshold (VTH) levels for a given block. Accordingly, let "s" denote the state of the block (e.g. the block has experienced "x" number of p/e cycles, "y" weeks of retention, etc.). As a result, the change of the mean of the i-th VTH distribution at word-line "w" can be expressed as: $VTH(i,w,s) = VTH(i,w,0) + \Delta \cdot a(i,w,s)$, where $VTH(i,w,0)$ is the VTH when the block is first programmed (e.g., at beginning of life). Moreover, $\Delta$ is a positive unit of VTH shift, and $a(i,w,s)$ denotes an integer value that represents the amount of shift of the i-th VTH distribution when the block is at state s relative to state 0.

Therefore, for a given state of a block, the 16 VTH distributions may be characterized by the set of integers: $a(i,w,s)$ for $i=0, \ldots, 15$. Using the right-most distribution as reference, the above set may be written as: $a'(0,w,s), a'(1,w,s), \ldots, a'(14,w,s), a'(15,w,s)$, where $a'(i,w,s) = a(i,w,s)/|a(15,w,s)|$. This normalized set represents the relative change of the 16 $V_{TH}$ distributions at state s with respect to the change of VTH $i=15$. For instance, let s corresponds to 1,000 cycles and 1 week of retention such that the following Equation 1 holds true:

$$\{a'(0,w,s), a'(1,w,s), \ldots, a'(14,w,s), a'(15,w,s)\} = \{-0.1, -0.2, \ldots, -0.8, -1\} \quad \text{Equation 1}$$

Accordingly, Equation 1 provides a representation of the shift of the mean of the VTH distributions which is related to a similar shift of the corresponding read voltages to compensate for the VTH changes. The previous representation of the VTH shift, $a'(i,w,s)$ for $i=0, \ldots, 15$, for word-line w and block state s, is further retained in a margin of block operations. This is because the relative shift of the 16 VTH distributions due to typical (e.g., non-transient) wear mechanisms is a relatively slow changing process. The relative change is typically driven by the physical mechanism responsible for the VTH shift (e.g. charge loss during retention). For example, typically, the relative change of the VTH distributions remains the same between 0 and 1 week of retention, but may change between 1 and 2 weeks of retention, and so on such that $\{a'(0,w,s1=1,000$ cycles and 0-1 week of retention), $a'(1,w,s1), \ldots, a'(14,w,s1), a'(15,w,s1)\} = \{-0.1, -0.2, -0.2, \ldots, -0.8, -1\}$. Moreover, $\{a'(0,w,s2=1,000$ cycles and 1-2 weeks of retention), $a'(1,w,s2), \ldots, a'(14,w,s2), a'(15,w,s2)\} = \{-0.2, -0.3, -0.3, \ldots, -0.9, -1\}$.

On the other hand, the absolute shift of the 16 VTH distributions may be a relatively fast process (e.g., at least with respect to the typical wear mechanisms), and it may also vary between different parts of the block (e.g., such as the different layers or groups of word-lines), due to processing variations, materials, etc., or other technology specific variability issues. Thus, {a'(0,w1 at low layers,s), a'(1, w1,s), . . . ,a'(14,w1,s), a'(15,w1,s)}={a'(0,w2 at upper layers), a'(1,w2,s), . . . ,a'(14,w2,s), a'(15,w2,s)}, however a(15,w1,s)=−4 while a(15,w2,s)=−5.

It follows that various ones of the approaches included herein are able to calibrate the read voltages at any given state s by identifying the current state s of the block, using one or more reference read voltages to determine the absolute shift of those reference voltages, and then determine the mapping of relative shifts of the remaining voltages with respect to the reference voltages at the given state s. Furthermore, the remaining non-reference read voltages may be adjusted based on the absolute shift, the relative shifts, and the current value of the respective read voltages (e.g., before calibration).

It should also be noted that none of the particular configurations included in any of the approaches included herein are intended to be limiting. For instance, the number and/or type of pages included in a given word-line and/or block of memory, the number and/or values of the read voltages, the number and/or values of the threshold voltage levels, etc., included in any of the approaches herein are in no way intended to be limiting, but rather have been presented by way of example only.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. The processor may be of any configuration as described herein, such as a discrete processor or a processing circuit that includes many components such as processing hardware, memory, I/O interfaces, etc. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

Figure 9:
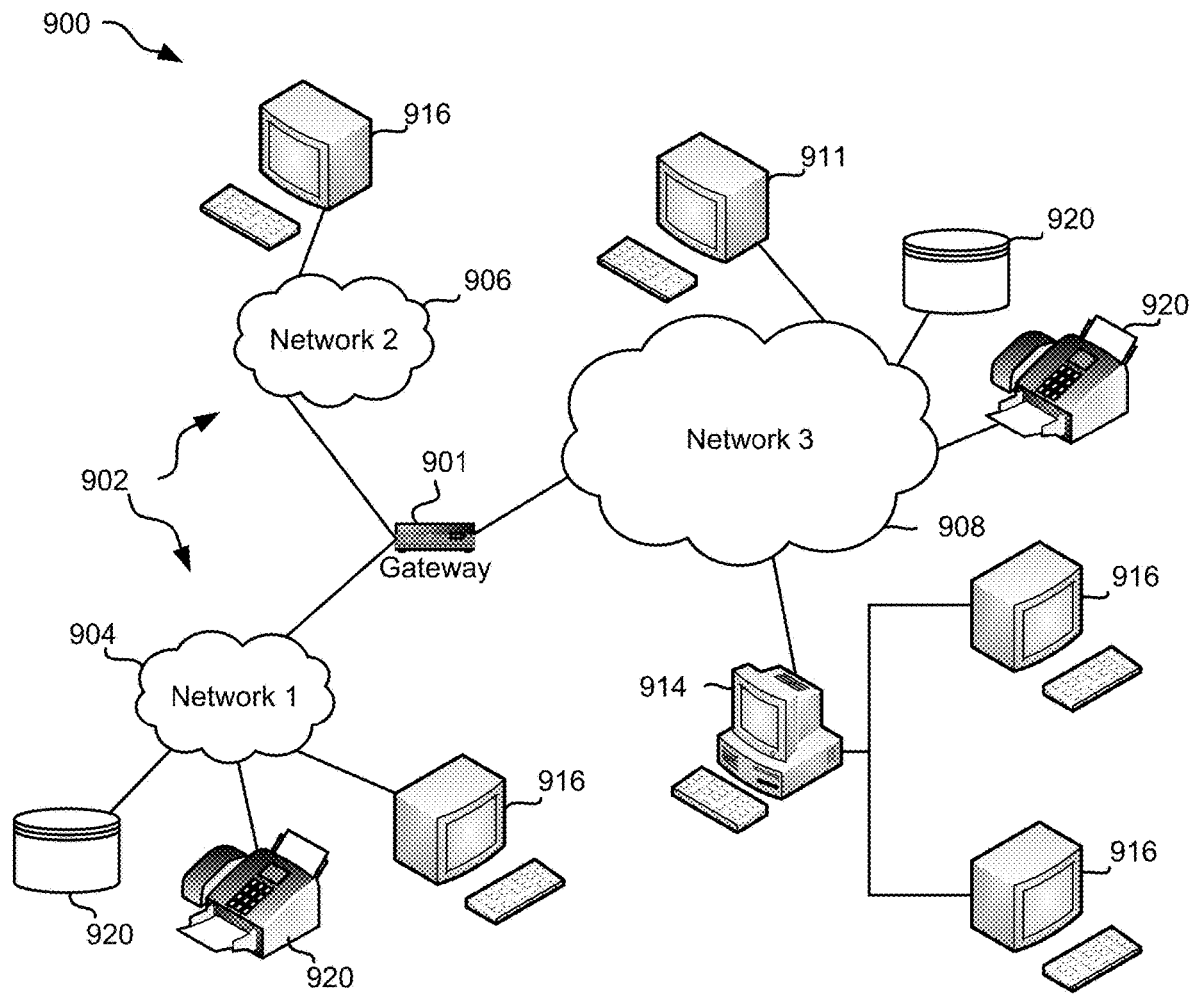
FIG. 9 is a network architecture, in accordance with one approach.

FIG. 9 illustrates a network architecture 900, in accordance with one approach. As shown in FIG. 9, a plurality of remote networks 902 are provided including a first remote network 904 and a second remote network 906. A gateway 901 may be coupled between the remote networks 902 and a proximate network 908. In the context of the present network architecture 900, the networks 904, 906 may each take any form including, but not limited to a LAN, a WAN such as the Internet, public switched telephone network (PSTN), internal telephone network, etc.

In use, the gateway 901 serves as an entrance point from the remote networks 902 to the proximate network 908. As such, the gateway 901 may function as a router, which is capable of directing a given packet of data that arrives at the gateway 901, and a switch, which furnishes the actual path in and out of the gateway 901 for a given packet.

Further included is at least one data server 914 coupled to the proximate network 908, and which is accessible from the remote networks 902 via the gateway 901. It should be noted that the data server(s) 914 may include any type of computing device/groupware. Coupled to each data server 914 is a plurality of user devices 916. Such user devices 916 may include a desktop computer, laptop computer, handheld computer, printer, and/or any other type of logic-containing device. It should be noted that a user device 911 may also be directly coupled to any of the networks, in some approaches.

A peripheral 920 or series of peripherals 920, e.g., facsimile machines, printers, scanners, hard disk drives, networked and/or local data storage units or systems, etc., may be coupled to one or more of the networks 904, 906, 908. It should be noted that databases and/or additional components may be utilized with, or integrated into, any type of network element coupled to the networks 904, 906, 908. In the context of the present description, a network element may refer to any component of a network.

According to some approaches, methods and systems described herein may be implemented with and/or on virtual systems and/or systems which emulate one or more other systems, such as a UNIX system which virtually hosts a MICROSOFT WINDOWS environment, etc. This virtualization and/or emulation may be enhanced through the use of VMWARE software, in some approaches.

In other approaches, one or more networks 904, 906, 908, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used, as known in the art.

Figure 10:
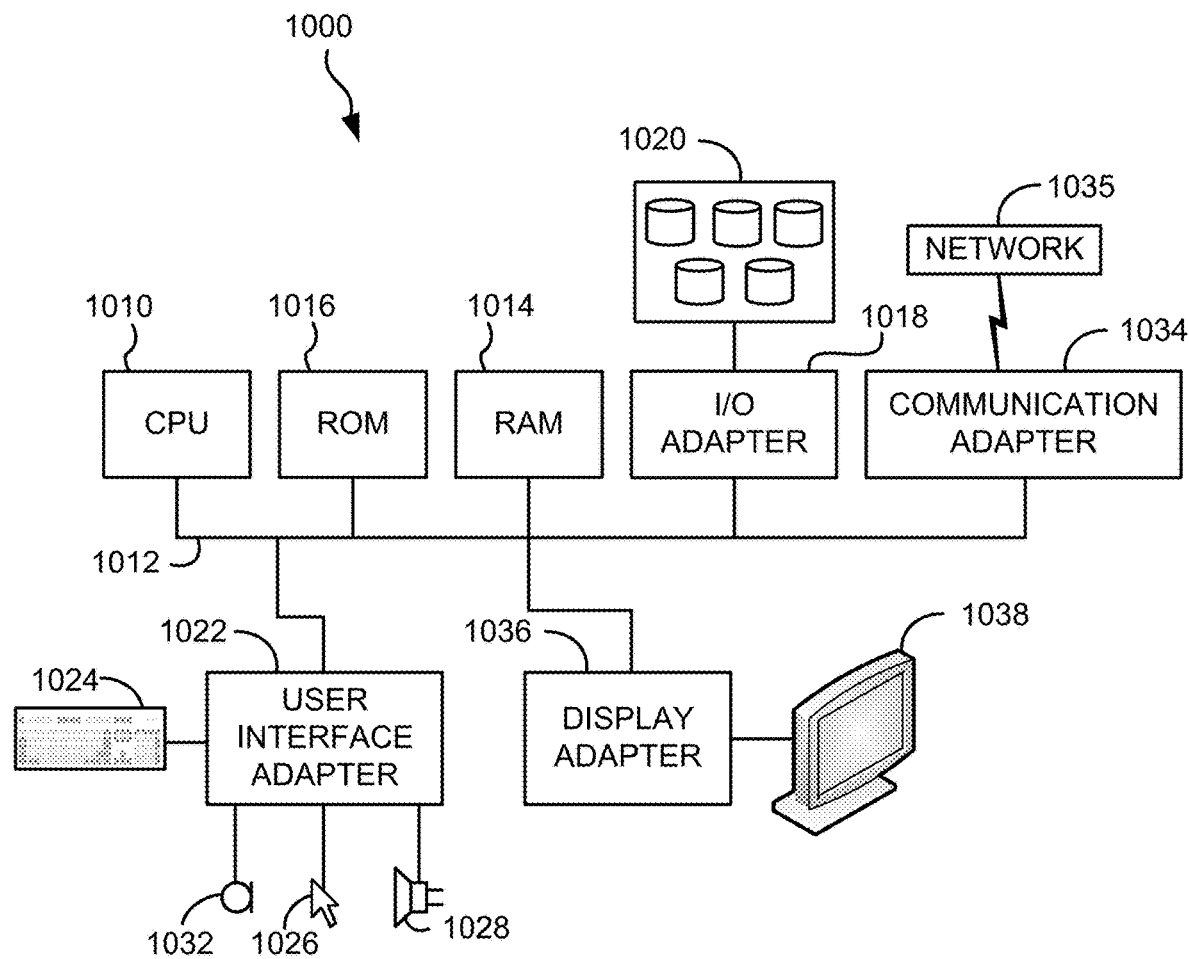
FIG. 10 is a representative hardware environment that may be associated with the servers and/or clients of FIG. 9, in accordance with one approach.

FIG. 10 shows a representative hardware environment associated with a user device 916 and/or server 914 of FIG. 9, in accordance with one approach. FIG. 10 illustrates a typical hardware configuration of a processor system 1000 having a central processing unit 1010, such as a microprocessor, and a number of other units interconnected via a system bus 1012, according to one approach. In some approaches, central processing unit 1010 may include any of the approaches described above with reference to the one or more processors 210 of FIG. 2.

The processor system 1000 shown in FIG. 10 includes a RAM 1014, Read Only Memory (ROM) 1016, and an I/O adapter 1018. According to some approaches, which are in no way intended to limit the invention, I/O adapter 1018 may include any of the approaches described above with reference to I/O adapter 218 of FIG. 2. Referring still to processor system 1000 of FIG. 10, the aforementioned components 1014, 1016, 1018 may be used for connecting peripheral devices such as storage subsystem 1020 to the bus 1012. In some approaches, storage subsystem 1020 may include a similar and/or the same configuration as data storage system 220 of FIG. 2. According to an example, which is in no way intended to limit the invention, storage subsystem 1020 may include non-volatile data storage cards, e.g., having NVRAM memory cards, RAM, ROM, and/or some other known type of non-volatile memory, in addition to RAID controllers as illustrated in FIG. 2.

With continued reference to FIG. 10, a user interface adapter 1022 for connecting a keyboard 1024, a mouse 1026, a speaker 1028, a microphone 1032, and/or other user interface devices such as a touch screen, a digital camera (not shown), etc., to the bus 1012.

Processor system 1000 further includes a communication adapter 1034 which connects the processor system 1000 to a communication network 1035 (e.g., a data processing network) and a display adapter 1036 which connects the bus 1012 to a display device 1038.

The processor system 1000 may have resident thereon an operating system such as the MICROSOFT WINDOWS Operating System (OS), a MAC OS, a UNIX OS, etc. It will be appreciated that a preferred approach may also be implemented on platforms and operating systems other than those mentioned. A preferred approach may be written using JAVA, XML, C, and/or C++ language, or other programming languages, along with an object oriented programming methodology. Object oriented programming (OOP), which has become increasingly used to develop complex applications, may be used.

Figure 11:
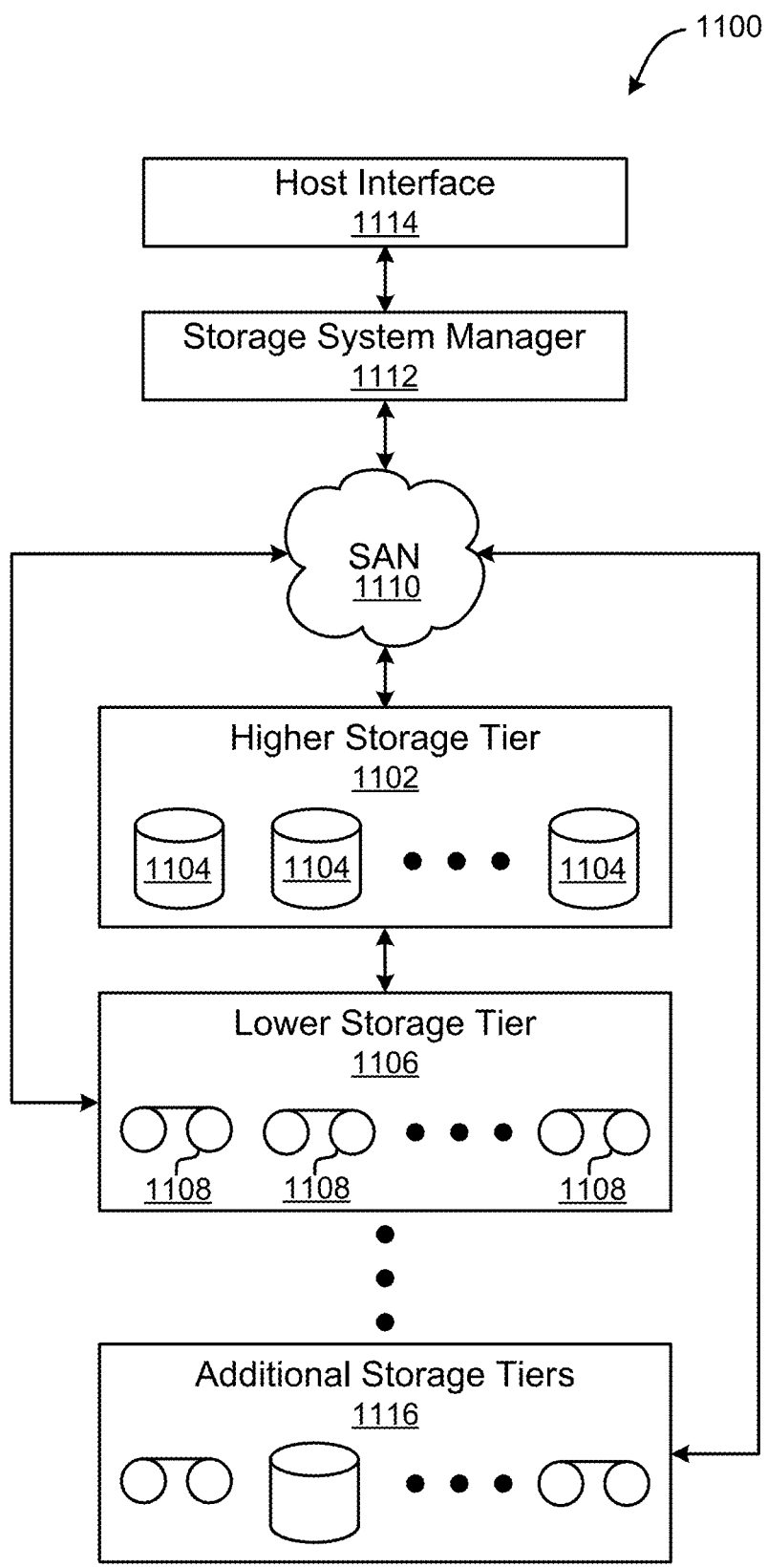
FIG. 11 is a tiered data storage system in accordance with one approach.

Moreover, FIG. 11 illustrates a storage system 1100 which implements high level (e.g., SSD) storage tiers in combination with lower level (e.g., magnetic tape) storage tiers, according to one approach. Note that some of the elements shown in FIG. 11 may be implemented as hardware and/or software, according to various approaches. The storage system 1100 may include a storage system manager 1112 for communicating with a plurality of media on at least one higher storage tier 1102 and at least one lower storage tier 1106. However, in other approaches, a storage system manager 1112 may communicate with a plurality of media on at least one higher storage tier 1102, but no lower storage tier. The higher storage tier(s) 1102 preferably may include one or more random access and/or direct access media 1104, such as hard disks, nonvolatile memory (NVM), NVRAM), solid state memory in SSDs, Flash memory, SSD arrays, Flash memory arrays, etc., and/or others noted herein or known in the art. According to illustrative examples, FIGS. 3-4 show exemplary architectures of SSD systems which may be used as a higher storage tier 1102 depending on the desired approach.

Referring still to FIG. 11, the lower storage tier(s) 1106 preferably includes one or more lower performing storage media 1108, including sequential access media such as magnetic tape in tape drives and/or optical media, slower accessing HDDs, slower accessing SSDs, etc., and/or others noted herein or known in the art. One or more additional storage tiers 1116 may include any combination of storage memory media as desired by a designer of the system 1100. Thus, the one or more additional storage tiers 1116 may, in some approaches, include a SSD system architecture similar or the same as those illustrated in FIGS. 1-2. Also, any of the higher storage tiers 1102 and/or the lower storage tiers 1106 may include any combination of storage devices and/or storage media.

The storage system manager 1112 may communicate with the storage media 1104, 1108 on the higher storage tier(s) 1102 and lower storage tier(s) 1106 through a network 1110, such as a storage area network (SAN), as shown in FIG. 11, or some other suitable network type. The storage system manager 1112 may also communicate with one or more host systems (not shown) through a host interface 1114, which may or may not be a part of the storage system manager 1112. The storage system manager 1112 and/or any other component of the storage system 1100 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more approaches, the storage system 1100 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 1102, may include a majority of SSD storage media for storing data in a higher performing storage environment, and remaining storage tiers, including lower storage tier 1106 and additional storage tiers 1116 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 1102, while data not having one of these attributes may be stored to the additional storage tiers 1116, including lower storage tier 1106. Of course, one of skill in the art, upon reading the present descriptions, may devise many other combinations of storage media types to implement into different storage schemes, according to the approaches presented herein.

According to some approaches, the storage system (such as 1100) may include logic configured to receive a request to open a data set, logic configured to determine if the requested data set is stored to a lower storage tier 1106 of a tiered data storage system 1100 in multiple associated portions, logic configured to move each associated portion of the requested data set to a higher storage tier 1102 of the tiered data storage system 1100, and logic configured to assemble the requested data set on the higher storage tier 1102 of the tiered data storage system 1100 from the associated portions.

Of course, this logic may be implemented as a method on any device and/or system or as a computer program product, according to various embodiments.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method for calibrating read voltages associated with a block of memory having more than one word-line therein, comprising:
   for each of the word-lines in the block:
   calculating an absolute shift value for a reference read voltage associated with the given word-line,
   determining a relative shift value for each of the remaining read voltages associated with the given word-line, wherein the relative shift values are determined with respect to the reference read voltage, and
   adjusting each of the read voltages associated with the given word-line using the absolute shift value and each of the respective relative shift values.

2. The computer-implemented method of claim 1, comprising:
   determining a current operating state of the block,
   wherein more than one read voltage is associated with each of the word-lines,
   wherein the relative shift values are determined for the remaining read voltages using a predetermined voltage mapping which corresponds to the current operating state of the block.

3. The computer-implemented method of claim 2, wherein determining the relative shift value for each of the remaining read voltages associated with the given word-line includes:
   matching the current operating state of the block with a corresponding one of a number of predetermined operating states; and
   extracting the relative shift values from the predetermined voltage mapping which is assigned to the matching predetermined operating state.

4. The computer-implemented method of claim 2, wherein the current operating state of the block is determined using one or more statistics which correspond to the block, wherein the one or more statistics used to determine the current operating state of the block are selected from the group consisting of: a cycle count, a read disturb count, and a retention time.

5. The computer-implemented method of claim 1, wherein the memory is non-volatile random access memory (NVRAM).

6. The computer-implemented method of claim 5, wherein the NVRAM includes three-dimensional triple-level-cell NAND Flash.

7. The computer-implemented method of claim 5, wherein the NVRAM includes three-dimensional quad-level-cell NAND Flash.

8. A computer program product for calibrating read voltages associated with a block of memory having more than one word-line therein, the computer program product comprising a computer readable storage medium having program instructions embodied therewith, the program instructions readable and/or executable by a processor to cause the processor to:
   for each of the word-lines in the block:
      calculate, by the processor, an absolute shift value for a reference read voltage associated with the given word-line,
      determine, by the processor, a relative shift value for each of the remaining read voltages associated with the given word-line, wherein the relative shift values are determined with respect to the reference read voltage, and
      adjust, by the processor, each of the read voltages associated with the given word-line using the absolute shift value and each of the respective relative shift values.

9. The computer program product of claim 8, wherein the program instructions are readable and/or executable by the processor to cause the processor to:
   determine, by the processor, a current operating state of the block,
   wherein more than one read voltage is associated with each of the word-lines,
   wherein the relative shift values are determined for the remaining read voltages using a predetermined voltage mapping which corresponds to the current operating state of the block.

10. The computer program product of claim 9, wherein determining the relative shift value for each of the remaining read voltages associated with the given word-line includes:
    matching the current operating state of the block with a corresponding one of a number of predetermined operating states; and
    extracting the relative shift values from the predetermined voltage mapping which is assigned to the matching predetermined operating state.

11. The computer program product of claim 9, wherein the current operating state of the block is determined using one or more statistics which correspond to the block, wherein the one or more statistics used to determine the current operating state of the block are selected from the group consisting of: a cycle count, a read disturb count, and a retention time.

12. The computer program product of claim 8, wherein the memory is non-volatile random access memory (NVRAM).

13. The computer program product of claim 12, wherein the NVRAM includes three-dimensional triple-level-cell NAND Flash.

14. The computer program product of claim 12, wherein the NVRAM includes three-dimensional quad-level-cell NAND Flash.

15. A system, comprising:
    a plurality of non-volatile random access memory (NVRAM) blocks configured to store data, wherein the blocks include more than one word-line therein;
    a processor; and
    logic integrated with and/or executable by the processor, the logic being configured to:
    for each of the word-lines in a given block:
       calculate, by the processor, an absolute shift value for a reference read voltage associated with the given word-line,
       determine, by the processor, a relative shift value for each remaining read voltage associated with the given word-line, wherein the relative shift values are determined with respect to the reference read voltage, and
       adjust, by the processor, each of the read voltages associated with the given word-line using the absolute shift value and each of the respective relative shift values.

16. The system of claim 15, wherein the logic is configured to:
    determine, by the processor, a current operating state of the given block,
    wherein more than one read voltage is associated with each of the word-lines,
    wherein the relative shift values are determined for the remaining read voltages using a predetermined voltage mapping which corresponds to the current operating state of the given block.

17. The system of claim 16, wherein determining the relative shift value for each of the remaining read voltages associated with the given word-line includes:
    matching the current operating state of the given block with a corresponding one of a number of predetermined operating states; and
    extracting the relative shift values from the predetermined voltage mapping which is assigned to the matching predetermined operating state.

18. The system of claim 16, wherein the current operating state of the given block is determined using one or more statistics which correspond to the block, wherein the one or more statistics used to determine the current operating state of the given block are selected from the group consisting of: a cycle count, a read disturb count, and a retention time.

19. The system of claim 15, wherein at least some of the NVRAM blocks are included in three-dimensional triple-level-cell NAND Flash.

20. The system of claim 15, wherein at least some of the NVRAM blocks are included in three-dimensional quad-level-cell NAND Flash.

* * * * *